United States Patent [19]
Shimpuku

[11] Patent Number: 5,699,061
[45] Date of Patent: Dec. 16, 1997

[54] METHOD AND APPARATUS FOR GENERATING NRZI CODE WITH LIMITED RUNS OF ONES

[75] Inventor: Yoshihide Shimpuku, Kanagawa, Japan

[73] Assignee: Sony Corporation, Tokyo, Japan

[21] Appl. No.: 674,285

[22] Filed: Jul. 1, 1996

Related U.S. Application Data

[63] Continuation of Ser. No. 309,981, Sep. 20, 1994, abandoned.

[30] Foreign Application Priority Data

Sep. 22, 1993 [JP] Japan ................. 5-236083

[51] Int. Cl.$^6$ ................................. H03M 5/06
[52] U.S. Cl. ................. 341/59; 341/73; 360/48
[58] Field of Search ................. 360/40, 39, 48; 341/68, 95, 106, 58, 73, 59

[56] References Cited

U.S. PATENT DOCUMENTS

| | | | |
|---|---|---|---|
| 4,201,980 | 5/1980 | Friedman et al. | 341/106 |
| 4,343,023 | 8/1982 | Nishimura et al. | 360/40 |
| 4,520,346 | 5/1985 | Shimada | 341/58 |
| 4,546,393 | 10/1985 | Mori et al. | 360/40 |
| 4,577,180 | 3/1986 | Fukuda | 341/73 |
| 4,598,267 | 7/1986 | Fukuda | 341/58 |
| 4,626,826 | 12/1986 | Fukuda et al. | 360/39 X |
| 4,707,681 | 11/1987 | Eggenberger et al. | 341/59 |
| 4,731,678 | 3/1988 | Takeuchi | 360/40 |
| 4,835,628 | 5/1989 | Hinz et al. | 630/48 |
| 5,136,436 | 8/1992 | Kahlman | 360/40 |
| 5,155,485 | 10/1992 | Sako et al. | 341/95 |
| 5,192,949 | 3/1993 | Suzuki et al. | 341/68 |

FOREIGN PATENT DOCUMENTS 0 558 310 A1  9/1993  European Pat. Off. ......... 341/59

Primary Examiner—Howard L. Williams
Attorney, Agent, or Firm—William S. Frommer; Alvin Sinderbrand

[57] ABSTRACT

An 8→10 modulator stores a conversion table, and, when receiving 8-bit data as an address, outputs 10-bit data stored at the received address as a modulated code. The conversion table of the 8→10 modulator is constructed such that each NRZI-represented 10-bit data includes at least one "0."

15 Claims, 14 Drawing Sheets

Fig. 4 Enlarged tape pattern

Relationship between linear recording density and error rate

No interference (Pr(1))

Pr(1,1)

ROLL OFF = 0.6

Pr(1,0,−1)

ROLL OFF = 0.6

Width of detection window $t_1 = t_2 > t_3$
$(t_3 = 0.7 t_2)$

Fig.9(a)
(RELATED ART)    1   0   1   1   0   1   0   0
Fig.9(b)
(RELATED ART)
Fig.9(c)
(RELATE ART)
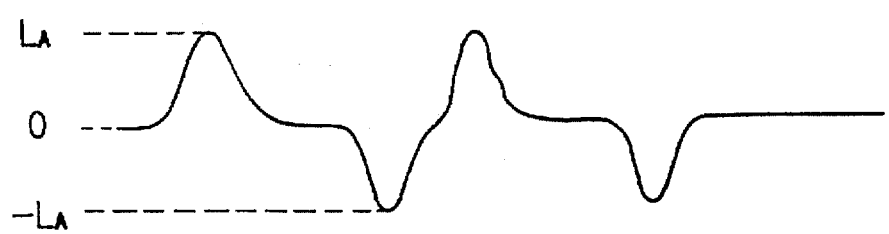

Fig.14(a) Dataword (RELATED ART)
Fig.14(b) Q output (RELATED ART)
Fig.14(c) Codeword (RELATED ART)
Fig.14(d) Modulated wave (RELATED ART)

METHOD AND APPARATUS FOR GENERATING NRZI CODE WITH LIMITED RUNS OF ONES

This application is a continuation of application Ser. No. 08/309,981, filed Sep. 20, 1994, now abandoned.

BACKGROUND OF THE INVENTION

The present invention relates to a magnetic recording apparatus suitable for use in recording information onto a magnetic recording medium such as a magnetic tape, a magnetic disk or a magneto-optical disk.

For example, in the DAT (digital audio tape recorder) or like apparatuses, data is recorded onto a magnetic tape after being subjected to block coding. That is, data is made 8-bit-unit data, for instance, and then converted to 10-bit-unit codes (hereinafter referred to as "8–10 conversion"). The 10-bit-unit conversion codes are subjected to the NRZI modulation, and then recorded onto the magnetic tape. Further, in this case, the data is recorded with such a recording linear density that no intersymbol interference occurs in reproducing the digital data or intersymbol interference can be eliminated even if it occurs.

That is, as shown in FIG. 9, when the NRZI-modulated conversion codes are "10110100 . . . " (FIG. 9(a)), the minimum inversion interval of the magnetization (indicated by arrows in FIG. 9(b)) on the magnetic tape is set at such an interval as causes no intersymbol interference during reproduction.

As a result, in a reproducing operation, the reproduction signal assumes a signal as obtained by differentiating the NRZI-modulated conversion data (see FIG. 9(c)). That is, the reproduction signal is such that the absolute value of a level (amplitude) corresponding to a position of inversion of magnetization on the magnetic tape (i.e., a position at which the NRZI-modulated conversion data takes "1") has approximately a prescribed level $L_A$ ($>0$), and that of a position not corresponding to inversion of magnetization (i.e., a position at which the NRZI-modulated conversion data takes "0") has approximately a 0 level.

Therefore, the original NRZI-modulated conversion codes can be restored by integrating the reproduction signal, and then judging whether the integrated signal is (or regarded as being) at the H level or L level, that is, performing a binary level judgment.

However, in the DAT that does not utilize the intersymbol interference as described above, a large reproduction signal is needed in a high frequency band and the minimum inversion interval of magnetization on the magnetic tape should be sufficiently long. Therefore, the recording linear density cannot be increased any further.

In view of the above, to improve the recording density, information recording and reproduction schemes which positively utilize the intersymbol interference have been proposed in recent years. For example, as shown in FIG. 10, when an input signal such as digital data or an AV signal is recorded, coding and modulating operations taking into account intersymbol interference that will occur in a reproducing operation are performed on the input signal in a coding modulator and a NRZI modulator, and the thus-processed input signal is amplified by a recording amplifier and recorded onto a recording medium such as a magnetic tape by a recording head.

On the other hand, in a reproducing operation, a reproduction signal is obtained from the magnetic tape by a reproduction head, and amplified by a reproduction amplifier. The amplified reproduction signal is input to a waveform interference device as an equalizer circuit for causing the above-mentioned intersymbol interference, and then sequentially input to a decoding demodulator and a NRZI demodulator, where it is subjected to decoding and demodulating operations.

An example of the intersymbol interference used in the above type of recording and reproduction scheme is the partial response. Among various kinds of partial responses, Pr(1, 1) (class I), Pr(1, −1), Pr(1, 0, −1) (class IV) are frequently used.

FIG. 11 shows a frequency characteristic of Pr(1, 1) (one of the kinds mentioned above) that is positive interference between adjacent codes, for instance. It is seen from FIG. 11 that in a high frequency band, Pr(1, 1) does not need a large reproduction signal, but a reproduction signal of approximately a half of a level (plotted by a dashed line in FIG. 11) needed in the single flow type coding which does not utilize the intersymbol interference.

For example, NRZI-modulated codes (codewords) "1, 0, 1, 0, 0, 1, 0, 1, 0, 1, 1, . . . " as shown in FIG. 12(b) is recorded and reproduced in the following manner by using Pr(1, 1). First, in a recording operation, the magnetic tape is magnetized by a flow of a recording current (modulated wave; see FIG. 12(c)) whose direction is reversed when the code is "1."

In FIG. 12(c), the recording current flowing direction is indicated by 1 and 0 with an assumption that the initial direction corresponds to 1.

In a reproducing operation, a NRZ-represented value (indicated under the recording current in FIG. 12(c) and taking 1 and 0 when the recording current flows in the direction of 1 and 0, respectively) of the recording current is added to an adjacent value, and an addition result becomes a reproduction signal (playback wave; see FIG. 12(d)).

That is, as shown in FIG. 12(c), when a NRZ representation of the recording current is "1, 0, 0, 1, 1, 1, 0, 0, 1, 1, 0, 1, . . . ," the first value of a signal (hereinafter also called a reproduction signal) obtained by integrating the reproduction signal is a sum of the first value "1" of the NRZ representation of the recording current and, for instance, a value "0" which adjoins it from the right side, i.e., "1 (=1+0)." And the second value is a sum of the second value "0" of the NRZ representation of the recording current and, for instance, a value "0" which adjoins it from the right side, i.e., "0 (=0+0)."

Further, the third value of the reproduction signal is a sum of the third value "0" of the NRZ representation of the recording current and a value "1" which adjoins it from the right side, i.e., "1 (=0+1)." And the fourth value is a sum of the fourth value "1" of the NRZ representation of the recording current and, for instance, a value "1" which adjoins it from the right side, i.e., "2 (=1+1)."

By repeating the above procedure, the reproduction signal is obtained as "1, 0, 1, 2, 2, 1, 0, 1, 2, 1, 1, 2, . . ." (see FIG. 12(d).

In FIG. 12(d), the reproduction signal is expressed by using values "1," "0" and "1" which are respectively obtained by offsetting the values "2," "1" and "0" by −1.

Therefore, where Pr(1, 1) is used, the reproduction signal is subjected to a ternary level judgment, and the original data is restored from results of the judgment.

By the way, when NRZI-modulated codes are recorded onto a magnetic tape etc., the recording current is not inverted while the code continues to be "0." That is, what is called $T_{max}/T_{min}$ ((maximum inversion interval)/(minimum inversion interval)) may be larger than a prescribed value (e.g., 4), in which case a reproduction signal has a low frequency to cause unstable reproduction.

To solve this problem, the following procedure is now employed. That is, to avoid many 0's from appearing continuously, data to be recorded is made data with a unit of an arbitrary number of bits, which is then converted to codes with a unit of a larger number of bits.

For example, as in the case of the above-described DAT, there will be considered the case where data to be recorded is made 8-bit-unit data, which is then converted to 10-bit-unit codes. To make $T_{max}/T_{min}$ not more than 4, the number of continuous 0's in the conversion codes should be 3 or less in the NRZI representation (in the NRZ representation, the number of continuously appearing same codes (0's or 1's) should be 4 or less).

On the other hand, where recording is performed by allocating each of 256 kinds of 8-bit data to one of arbitrarily selected 256 kinds of 10-bit codes, if the codes include a DC component, a reproduction signal is offset by an amount corresponding to the DC component to become a time-axis varied signal.

Therefore, each 8-bit data needs to be allocated to a 10-bit code in which the number of continuous 0's is 3 or less and a DC component is 0. However, there exist only 193 kinds of such 10-bit codes.

In view of the above, there has been developed an information conversion scheme as disclosed, for instance, in Japanese Unexamined Patent Publication No. Sho. 59-200562 published on Nov. 13, 1984 (corresponding to U.S. Pat. No. 4,598,267 patented on Jul. 1, 1986). This scheme uses, in addition to the above 193 kinds (a first combination), a second combination consisting of 10-bit codes which satisfy a condition that the number of continuous 0's in the conversion code is 3 or less in the NRZI representation, and in which a DC component is −2 (or +2).

In this information conversion scheme, when 10-bit data of the second combination is used after 10-bit data of the first combination was used to convert 8-bit data, a DC component of −2 (or +2) of the previously used 10-bit data of the second combination can be canceled by inverting the head bit (changing the head bit to 0 if it is 1, and vice versa).

An example of a conversion table for an 8–10 conversion equivalent to the above information conversion scheme is shown below.

TABLE 1

| Dataword: | 8 bits data |
| Codeword: | Encoded code to NRZI modulator selected by Q'(Q information from the previous code) |
| Coding direction: | From left to right (from MSB to LSB) |
| Q': | DC information of the previous code |
| Q: | DC information of the code |

| | | Q' = −1 | | Q' = 1 | | |
|---|---|---|---|---|---|---|
| Dataword (MSB–LSB) | Codeword (MSB–LSB) | DC | Q | Codeword (MSB–LSB) | DC | Q |
| 00 | 00000000 | 0101010101 | 0 | 1 | 0101010101 | 0 | −1 |
| 01 | 00000001 | 0101010111 | 0 | −1 | 0101010111 | 0 | 1 |
| 02 | 00000010 | 0101011101 | 0 | −1 | 0101011101 | 0 | 1 |
| 03 | 00000011 | 0101011111 | 0 | 1 | 0101011111 | 0 | −1 |
| 04 | 00000100 | 0101001001 | 0 | −1 | 0101001001 | 0 | 1 |
| 05 | 00000101 | 0101001011 | 0 | 1 | 0101001011 | 0 | −1 |
| 06 | 00000110 | 0101001110 | 0 | 1 | 0101001110 | 0 | −1 |

TABLE 1-continued

| Dataword: | 8 bits data |
| Codeword: | Encoded code to NRZI modulator selected by Q'(Q information from the previous code) |
| Coding direction: | From left to right (from MSB to LSB) |
| Q': | DC information of the previous code |
| Q: | DC information of the code |

| | | Q' = −1 | | Q' = 1 | | |
|---|---|---|---|---|---|---|
| Dataword (MSB–LSB) | Codeword (MSB–LSB) | DC | Q | Codeword (MSB–LSB) | DC | Q |
| 07 | 00000111 | 0101011010 | 0 | 1 | 0101011010 | 0 | −1 |
| 08 | 00001000 | 0101110101 | 0 | −1 | 0101110101 | 0 | 1 |
| 09 | 00001001 | 0101110111 | 0 | 1 | 0101110111 | 0 | −1 |
| 0A | 00001010 | 0101111101 | 0 | 1 | 0101111101 | 0 | −1 |
| 0B | 00001011 | 0101111111 | 0 | −1 | 0101111111 | 0 | 1 |
| 0C | 00001100 | 0101101001 | 0 | 1 | 0101101001 | 0 | −1 |
| 0D | 00001101 | 0101101011 | 0 | −1 | 0101101010 | 0 | 1 |
| 0E | 00001110 | 0101101110 | 0 | −1 | 0101101110 | 0 | 1 |
| 0F | 00001111 | 0101111010 | 0 | −1 | 0101111010 | 0 | 1 |
| 10 | 00010000 | 1101010010 | 0 | 1 | 1101010010 | 0 | −1 |
| 11 | 00010001 | 0100010010 | 2 | −1 | 1100010010 | −2 | −1 |
| 12 | 00010010 | 0101010010 | 0 | −1 | 0101010010 | 0 | 1 |
| 13 | 00010011 | 0101110010 | 0 | 1 | 0101110010 | 0 | −1 |
| 14 | 00010100 | 1101110001 | 2 | 1 | 0101110001 | −2 | 1 |
| 15 | 00010101 | 1101110011 | 2 | −1 | 0101110011 | −2 | −1 |
| 16 | 00010110 | 1101110110 | 2 | −1 | 0101110110 | −2 | −1 |
| 17 | 00010111 | 1101110010 | 0 | −1 | 1101110010 | 0 | 1 |
| 18 | 00011000 | 0101100101 | 2 | −1 | 1101100101 | −2 | −1 |
| 19 | 00011001 | 0101100111 | 2 | 1 | 1101100111 | −2 | 1 |
| 1A | 00011010 | 0101101101 | 2 | 1 | 1101101101 | −2 | 1 |
| 1B | 00011011 | 0101101111 | 2 | −1 | 1101101111 | −2 | −1 |
| 1C | 00011100 | 0101111001 | 2 | 1 | 1101111001 | −2 | 1 |
| 1D | 00011101 | 0101111011 | 2 | −1 | 1101111011 | −2 | −1 |
| 1E | 00011110 | 0101111110 | 2 | −1 | 1101111110 | −2 | −1 |
| 1F | 00011111 | 0101101010 | 2 | −1 | 1101101010 | −2 | −1 |

TABLE 2

| | | Q' = −1 | | Q' = 1 | | |
|---|---|---|---|---|---|---|
| Dataword (MSB–LSB) | Codeword (MSB–LSB) | DC | Q | Codeword (MSB–LSB) | DC | Q |
| 20 | 00100000 | 0111010101 | 0 | −1 | 0111010101 | 0 | 1 |
| 21 | 00100001 | 0111010111 | 0 | 1 | 0111010111 | 0 | −1 |
| 22 | 00100010 | 0111011101 | 0 | 1 | 0111011101 | 0 | −1 |
| 23 | 00100011 | 0111011111 | 0 | −1 | 0111011111 | 0 | 1 |
| 24 | 00100100 | 1111010001 | 2 | 1 | 0111010001 | −2 | 1 |
| 25 | 00100101 | 1111010011 | 2 | −1 | 0111010011 | −2 | −1 |
| 26 | 00100110 | 1111010110 | 2 | −1 | 0111011010 | 0 | 1 |
| 27 | 00100111 | 0111011010 | 0 | −1 | 0111011010 | 0 | 1 |
| 28 | 00101000 | 0111110101 | 0 | 1 | 0111110101 | 0 | −1 |
| 29 | 00101001 | 0111110111 | 0 | −1 | 0111110111 | 0 | 1 |
| 2A | 00101010 | 0111111101 | 0 | −1 | 0111111101 | 0 | 1 |
| 2B | 00101011 | 0111111111 | 0 | 1 | 0111111111 | 0 | −1 |
| 2C | 00101100 | 0111101001 | 0 | −1 | 0111101001 | 0 | 1 |
| 2D | 00101101 | 0111101011 | 0 | 1 | 0111101011 | 0 | −1 |
| 2E | 00101110 | 0111101110 | 0 | 1 | 0111101110 | 0 | −1 |
| 2F | 00101111 | 0111111010 | 0 | 1 | 0111111010 | 0 | −1 |
| 30 | 00110000 | 0111010010 | 0 | 1 | 0111010010 | 0 | −1 |
| 31 | 00110001 | 1110010010 | 2 | −1 | 0110010010 | −2 | −1 |
| 32 | 00110010 | 1111010010 | 0 | −1 | 1111010010 | 0 | −1 |
| 33 | 00110011 | 1111110010 | 0 | 1 | 1111110010 | 0 | −1 |
| 34 | 00110100 | 0111110001 | 2 | 1 | 1111110001 | −2 | 1 |
| 35 | 00110101 | 0111110011 | 2 | −1 | 1111110011 | −2 | −1 |
| 36 | 00110110 | 0111110110 | 2 | −1 | 1111110110 | −2 | −1 |
| 37 | 00110111 | 0111110010 | 0 | −1 | 1111110010 | 0 | 1 |
| 38 | 00111000 | 0111000101 | 2 | −1 | 1111000101 | −2 | −1 |
| 39 | 00111001 | 0111000111 | 2 | 1 | 1111000111 | −2 | 1 |
| 3A | 00111010 | 0111001101 | 2 | 1 | 1111001101 | −2 | 1 |
| 3B | 00111010 | 0111001111 | 2 | −1 | 1111001111 | −2 | −1 |
| 3C | 00111011 | 0111011001 | 2 | 1 | 1111011001 | −2 | 1 |
| 3D | 00111100 | 0111011011 | 2 | −1 | 1111011011 | −2 | −1 |
| 3E | 00111110 | 0111011110 | 2 | −1 | 1111011110 | −2 | −1 |
| 3F | 00111111 | 0111001010 | 2 | −1 | 1111001010 | −2 | −1 |

TABLE 2-continued

| Dataword (MSB–LSB) | Codeword (MSB–LSB) | DC | Q | Codeword (MSB–LSB) | DC | Q |
|---|---|---|---|---|---|---|
| | | | Q' = −1 | Q' = 1 | | |
| 40 01000000 | 0100010101 | 2 | 1 1100010101 | −2 | 1 |
| 41 01000001 | 0100010111 | 2 | −1 1100010111 | −2 | −1 |
| 42 01000010 | 0100011101 | 2 | −1 1100011101 | −2 | −1 |
| 43 01000011 | 0100011111 | 2 | 1 1100011111 | −2 | 1 |
| 44 01000100 | 0101010001 | 2 | 1 1101010001 | −2 | 1 |
| 45 01000101 | 0101010011 | 2 | −1 1101010011 | −2 | −1 |
| 46 01000110 | 0101010110 | 2 | −1 1101010110 | −2 | −1 |
| 47 01000111 | 0100011010 | 2 | 1 1100011010 | −2 | 1 |
| 48 01001000 | 0100110101 | 2 | −1 1100110101 | −2 | −1 |
| 49 01001001 | 0100110111 | 2 | 1 1100110111 | −2 | 1 |
| 4A 01001010 | 0100111101 | 2 | 1 1100111101 | −2 | 1 |
| 4B 01001011 | 0100111111 | 2 | −1 1100111111 | −2 | −1 |
| 4C 01001100 | 0100101001 | 2 | 1 1100101001 | −2 | 1 |
| 4D 01001101 | 0100101011 | 2 | −1 1100101011 | −2 | −1 |
| 4E 01001110 | 0100101110 | 2 | −1 1100101110 | −2 | −1 |
| 4F 01001111 | 0100111010 | 2 | −1 1100111010 | −2 | −1 |

TABLE 3

| Dataword (MSB–LSB) | Codeword (MSB–LSB) | DC | Q | Codeword (MSB–LSB) | DC | Q |
|---|---|---|---|---|---|---|
| | | | Q' = −1 | Q' = 1 | | |
| 50 01010000 | 0100100101 | 0 | −1 0100100101 | 0 | 1 |
| 51 01010001 | 0100100111 | 0 | 1 0100100111 | 0 | −1 |
| 52 01010010 | 0100101101 | 0 | 1 0100101101 | 0 | −1 |
| 53 01010011 | 0100101111 | 0 | −1 0100101111 | 0 | 1 |
| 54 01010100 | 0100111001 | 0 | 1 0100111001 | 0 | −1 |
| 55 01010101 | 0100111011 | 0 | −1 0100111011 | 0 | 1 |
| 56 01010110 | 0100111110 | 0 | 1 0100111110 | 0 | −1 |
| 57 01010111 | 0100101010 | 0 | −1 0100101010 | 0 | 1 |
| 58 01011000 | 0110100101 | 0 | 1 0110100101 | 0 | −1 |
| 59 01011001 | 0110100111 | 0 | −1 0110100111 | 0 | 1 |
| 5A 01011010 | 0110101101 | 0 | 1 0110101101 | 0 | −1 |
| 5B 01011011 | 0110101111 | 0 | 1 0110101111 | 0 | −1 |
| 5C 01011100 | 0110111001 | 0 | −1 0110111001 | 0 | 1 |
| 5D 01011101 | 0110111011 | 0 | 1 0110111011 | 0 | −1 |
| 5E 01011110 | 0110111110 | 0 | −1 0110111110 | 0 | −1 |
| 5F 01011111 | 0110101010 | 0 | 1 0110101010 | 0 | 1 |
| 60 01100000 | 0010010101 | 0 | −1 0010010101 | 0 | 1 |
| 61 01100001 | 0010010111 | 0 | 1 0010010111 | 0 | −1 |
| 62 01100010 | 0010011101 | 0 | 1 0010011101 | 0 | −1 |
| 63 01100011 | 0010011111 | 0 | −1 0010011111 | 0 | 1 |
| 64 01100100 | 1010010001 | 2 | 1 0010010001 | −2 | 1 |
| 65 01100100 | 1010010011 | 2 | −1 0010010011 | −2 | −1 |
| 66 01100110 | 1010010110 | 2 | −1 0010010110 | −2 | −1 |
| 67 01100111 | 0010011010 | 0 | −1 0010011010 | 0 | 1 |
| 68 01101000 | 0010110101 | 0 | 1 0010110101 | 0 | −1 |
| 69 01101001 | 0010110111 | 0 | −1 0010110111 | 0 | 1 |
| 6A 01101010 | 0010111101 | 0 | −1 0010111101 | 0 | 1 |
| 6B 01101011 | 0010111111 | 0 | 1 0010111111 | 0 | −1 |
| 6C 01101100 | 0010101001 | 0 | −1 0010101001 | 0 | 1 |
| 6D 01101101 | 0010101011 | 0 | 1 0010101011 | 0 | −1 |
| 6E 01101110 | 0010101110 | 0 | 1 0010101110 | 0 | −1 |
| 6F 01101111 | 0010111010 | 0 | 1 0010111010 | 0 | −1 |
| 70 01110000 | 0010010010 | 0 | 1 0010010010 | 0 | −1 |
| 71 01110001 | 1011010010 | 2 | −1 0011010010 | −2 | −1 |
| 72 01110010 | 1010010010 | 0 | −1 1010010010 | 0 | 1 |
| 73 01110011 | 1010110010 | 0 | 1 1010110010 | 0 | −1 |
| 74 01110100 | 0010110001 | 2 | 1 1010110001 | −2 | 1 |
| 75 01110101 | 0010110011 | 2 | −1 1010110011 | −2 | −1 |
| 76 01110110 | 0010110110 | 2 | −1 1010110110 | −2 | −1 |
| 77 01110111 | 0010110010 | 0 | 1 0010110010 | 0 | −1 |
| 78 01111000 | 0011100101 | 0 | 1 0011100101 | 0 | −1 |
| 79 01111001 | 0011100111 | 0 | 1 0011100111 | 0 | −1 |
| 7A 01111010 | 0011101101 | 0 | 1 0011101101 | 0 | −1 |
| 7B 01111011 | 0011101111 | 0 | 1 0011101111 | 0 | −1 |
| 7C 01111100 | 0011111001 | 0 | −1 0011111001 | 0 | 1 |
| 7D 01111101 | 0011111011 | 0 | 1 0011111011 | 0 | −1 |
| 7E 01111110 | 0011111110 | 0 | 1 0011111110 | 0 | −1 |

TABLE 3-continued

| Dataword (MSB–LSB) | Codeword (MSB–LSB) | DC | Q | Codeword (MSB–LSB) | DC | Q |
|---|---|---|---|---|---|---|
| | | | Q' = −1 | Q' = 1 | | |
| 7F 01111111 | 0011101010 | 0 | 1 0011101010 | 0 | −1 |

TABLE 4

| Dataword (MSB–LSB) | Codeword (MSB–LSB) | DC | Q | Codeword (MSB–LSB) | DC | Q |
|---|---|---|---|---|---|---|
| | | | Q' = −1 | Q' = 1 | | |
| 80 10000000 | 1010010101 | 0 | 1 1010010101 | 0 | −1 |
| 81 10000001 | 1010010111 | 0 | −1 1010010111 | 0 | 1 |
| 82 10000010 | 1010011101 | 0 | −1 1010011101 | 0 | 1 |
| 83 10000011 | 1010011111 | 0 | 1 1010011111 | 0 | −1 |
| 84 10000100 | 1010001001 | 0 | −1 1010001001 | 0 | 1 |
| 85 10000101 | 1010001011 | 0 | 1 1010001011 | 0 | −1 |
| 86 10000110 | 1010001110 | 0 | 1 1010001110 | 0 | −1 |
| 87 10000111 | 1010011010 | 0 | 1 1010011010 | 0 | −1 |
| 88 10001000 | 1010110101 | 0 | −1 1010110101 | 0 | 1 |
| 89 10001001 | 1010110111 | 0 | 1 1010110111 | 0 | −1 |
| 8A 10001010 | 1010111101 | 0 | 1 1010111101 | 0 | −1 |
| 8B 10001011 | 1010111111 | 0 | −1 1010111111 | 0 | 1 |
| 8C 10001100 | 1010101001 | 0 | 1 1010101001 | 0 | −1 |
| 8D 10001101 | 1010101011 | 0 | −1 1010101011 | 0 | 1 |
| 8E 10001110 | 1010101110 | 0 | −1 1010101110 | 0 | 1 |
| 8F 10001111 | 1010111010 | 0 | −1 1010111010 | 0 | 1 |
| 90 10010000 | 1100100101 | 0 | 1 1100100101 | 0 | −1 |
| 91 10010001 | 1100100111 | 0 | −1 1100100111 | 0 | 1 |
| 92 10010010 | 1100101101 | 0 | −1 1100101101 | 0 | 1 |
| 93 10010011 | 1100101111 | 0 | 1 1100101111 | 0 | −1 |
| 94 10010100 | 1100111001 | 0 | −1 1100111001 | 0 | 1 |
| 95 10010101 | 1100111011 | 0 | 1 1100111011 | 0 | −1 |
| 96 10010110 | 1100111110 | 0 | 1 1100111110 | 0 | −1 |
| 97 10010111 | 1100101010 | 0 | 1 1100101010 | 0 | −1 |
| 98 10011000 | 1010100101 | 2 | −1 0010100101 | −2 | −1 |
| 99 10011001 | 1010100111 | 2 | 1 0010100111 | −2 | 1 |
| 9A 10011010 | 1010101101 | 2 | 1 0010101101 | −2 | 1 |
| 9B 10011011 | 1010101111 | 2 | −1 0010101111 | −2 | −1 |
| 9C 10011100 | 1010111001 | 2 | 1 0010111001 | −2 | 1 |
| 9D 10011101 | 1010111011 | 2 | −1 0010111011 | −2 | −1 |
| 9E 10011110 | 1010111110 | 2 | −1 0010111110 | −2 | −1 |
| 9F 10011111 | 1010101010 | 2 | −1 0010101010 | −2 | −1 |
| A0 10100000 | 1011010101 | 2 | 1 0011010101 | −2 | 1 |
| A1 10100001 | 1011010111 | 2 | −1 0011010111 | −2 | −1 |
| A2 10100010 | 1011011101 | 2 | −1 0011011101 | −2 | −1 |
| A3 10100011 | 1011011111 | 2 | 1 0011011111 | −2 | 1 |
| A4 10100100 | 1011001001 | 2 | −1 0011001001 | −2 | −1 |
| A5 10100101 | 1011001011 | 2 | 1 0011001011 | −2 | 1 |
| A6 10100110 | 1011001110 | 2 | 1 0011001110 | −2 | 1 |
| A7 10100111 | 1011011010 | 2 | 1 0011011010 | −2 | 1 |
| A8 10101000 | 1011110101 | 2 | −1 0011110101 | −2 | −1 |
| A9 10101001 | 1011110111 | 2 | 1 0011110111 | −2 | 1 |
| AA 10101010 | 1011111101 | 2 | 1 0011111101 | −2 | 1 |
| AB 10101011 | 1011111111 | 2 | −1 0011111111 | −2 | −1 |
| AC 10101100 | 1011101001 | 2 | 1 0011101001 | −2 | 1 |
| AD 10101101 | 1011101011 | 2 | −1 0011101011 | −2 | −1 |
| AE 10101110 | 1011101110 | 2 | −1 0011101110 | −2 | −1 |
| AF 10101111 | 1011111010 | 2 | −1 0011111010 | −2 | −1 |

TABLE 5

| Dataword (MSB–LSB) | Codeword (MSB–LSB) | DC | Q | Codeword (MS–LSB) | DC | Q |
|---|---|---|---|---|---|---|
| | | | Q' = −1 | Q' = 1 | | |
| B0 10110000 | 1101110101 | 0 | 1 1101110101 | 0 | −1 |
| B1 10110001 | 1101110111 | 0 | −1 1101110111 | 0 | 1 |
| B2 10110010 | 1101111101 | 0 | −1 1101111101 | 0 | 1 |
| B3 10110011 | 1101111111 | 0 | 1 1101111111 | 0 | −1 |

TABLE 5-continued

| Dataword (MSB–LSB) | Codeword (MSB–LSB) | DC | Q' = –1 Codeword Q (MS–LSB) | DC | Q' = 1 Q |
|---|---|---|---|---|---|
| B4 | 10110100 | 1101101001 | 0 | –1 1101101001 | 0 | 1 |
| B5 | 10110101 | 1101101011 | 0 | 1 1101101011 | 0 | –1 |
| B6 | 10110110 | 1101101110 | 0 | 1 1101101110 | 0 | –1 |
| B7 | 10110111 | 1101111010 | 0 | 1 1101111010 | 0 | –1 |
| B8 | 10111000 | 1011100101 | 0 | –1 1011100101 | 0 | 1 |
| B9 | 10111001 | 1011100111 | 0 | 1 1011100111 | 0 | –1 |
| BA | 10111010 | 1011101101 | 0 | 1 1011101101 | 0 | –1 |
| BB | 10111011 | 1011101111 | 0 | –1 1011101111 | 0 | 1 |
| BC | 10111100 | 1011111001 | 0 | 1 1011111001 | 0 | –1 |
| BD | 10111101 | 1011111011 | 0 | –1 1011111011 | 0 | 1 |
| BE | 10111110 | 1011111110 | 0 | –1 1011111110 | 0 | 1 |
| BF | 10111111 | 1011101010 | 0 | –1 1011101010 | 0 | 1 |
| C0 | 11000000 | 1110010101 | 2 | 1 0110010101 | –2 | 1 |
| C1 | 11000001 | 1110010111 | 2 | –1 0110010111 | –2 | –1 |
| C2 | 11000010 | 1110011101 | 2 | –1 0110011101 | –2 | –1 |
| C3 | 11000011 | 1110011111 | 2 | 1 0110011111 | –2 | 1 |
| C4 | 11000100 | 1110001001 | 2 | –1 0110001001 | –2 | –1 |
| C5 | 11000101 | 1110001011 | 2 | 1 0110001011 | –2 | 1 |
| C6 | 11000110 | 1110001110 | 2 | 1 0110001110 | –2 | 1 |
| C7 | 11000111 | 1110011010 | 2 | 1 0110011010 | –2 | 1 |
| C8 | 11001000 | 1110110101 | 2 | –1 0110110101 | –2 | –1 |
| C9 | 11001001 | 1110110111 | 2 | 1 0110110111 | –2 | 1 |
| CA | 11001010 | 1110111101 | 2 | 1 0110111101 | –2 | 1 |
| CB | 11001011 | 1110111111 | 2 | –1 0110111111 | –2 | –1 |
| CC | 11001100 | 1110101001 | 2 | 1 0110101001 | –2 | 1 |
| CD | 11001101 | 1110101011 | 2 | –1 0110101011 | –2 | –1 |
| CE | 11001110 | 1110101110 | 2 | –1 0110101110 | –2 | –1 |
| CF | 11001111 | 1110111010 | 2 | –1 0110111010 | –2 | –1 |
| D0 | 11010000 | 1101000101 | 2 | –1 0101000101 | –2 | –1 |
| D1 | 11010001 | 1101000111 | 2 | 1 0101000111 | –2 | 1 |
| D2 | 11010010 | 1101001101 | 2 | 1 0101001101 | –2 | 1 |
| D3 | 11010011 | 1101001111 | 2 | –1 0101001111 | –2 | –1 |
| D4 | 11010100 | 1101011001 | 2 | 1 0101011001 | –2 | 1 |
| D5 | 11010101 | 1101011011 | 2 | –1 0101011011 | –2 | –1 |
| D6 | 11010110 | 1101011110 | 2 | –1 0101011110 | –2 | –1 |
| D7 | 11010111 | 1101001010 | 2 | –1 0101001010 | –2 | –1 |
| D8 | 11011000 | 1110100101 | 0 | –1 1110100101 | 0 | 1 |
| D9 | 11011001 | 1110100111 | 0 | 1 1110100111 | 0 | –1 |
| DA | 11011010 | 1110101101 | 0 | 1 1110101101 | 0 | –1 |
| DB | 11011011 | 1110101111 | 0 | –1 1110101111 | 0 | 1 |
| DC | 11011100 | 1110111001 | 0 | 1 1110111001 | 0 | –1 |
| DD | 11011101 | 1110111011 | 0 | –1 1110111011 | 0 | 1 |
| DE | 11011110 | 1110111110 | 0 | –1 1110111110 | 0 | 1 |
| DF | 11011111 | 1110101010 | 0 | –1 1110101010 | 0 | 1 |

TABLE 6

| Dataword (MSB–LSB) | Codeword (MSB–LSB) | DC | Q' = –1 Codeword Q (MSB–LSB) | DC | Q' = 1 Q |
|---|---|---|---|---|---|
| E0 | 11100000 | 1111010101 | 0 | 1 1111010101 | 0 | –1 |
| E1 | 11100001 | 1111010111 | 0 | –1 1111010111 | 0 | 1 |
| E2 | 11100010 | 1111011101 | 0 | –1 1111011101 | 0 | 1 |
| E3 | 11100011 | 1111011111 | 0 | 1 1111011111 | 0 | –1 |
| E4 | 11100100 | 1111001001 | 0 | –1 1111001001 | 0 | 1 |
| E5 | 11100101 | 1111001011 | 0 | 1 1111001011 | 0 | –1 |
| E6 | 11100110 | 1111001110 | 0 | 1 1111001110 | 0 | –1 |
| E7 | 11100111 | 1111011010 | 0 | 1 1111011010 | 0 | –1 |
| E8 | 11101000 | 1111101101 | 0 | –1 1111101101 | 0 | 1 |
| E9 | 11101001 | 1111110111 | 0 | 1 1111110111 | 0 | –1 |
| EA | 11101010 | 1111111101 | 0 | 1 1111111101 | 0 | – |
| EB | 11101011 | 1111111111 | 0 | –1 1111111111 | 0 | 1 |
| EC | 11101100 | 1111101001 | 0 | 1 1111101001 | 0 | –1 |
| ED | 11101101 | 1111101011 | 0 | –1 1111101011 | 0 | 1 |
| EE | 11101110 | 1111101110 | 0 | –1 1111101110 | 0 | 1 |
| EF | 11101111 | 1111111010 | 0 | –1 1111111010 | 0 | 1 |
| F0 | 11110000 | 1101010101 | 0 | –1 1101010101 | 0 | 1 |
| F1 | 11110001 | 1101010111 | 0 | 1 1101010111 | 0 | –1 |
| F2 | 11110010 | 1101011101 | 0 | 1 1101011101 | 0 | –1 |

TABLE 6-continued

| Dataword (MSB–LSB) | Codeword (MSB–LSB) | DC | Q' = –1 Codeword Q (MSB–LSB) | DC | Q' = 1 Q |
|---|---|---|---|---|---|
| F3 | 11110011 | 1101011111 | 0 | –1 1101011111 | 0 | 1 |
| F4 | 11110100 | 1101001001 | 0 | 1 1101001001 | 0 | –1 |
| F5 | 11110101 | 1101001011 | 0 | –1 1101001011 | 0 | 1 |
| F6 | 11110110 | 1101001110 | 0 | –1 1101001110 | 0 | 1 |
| F7 | 11110111 | 1101011010 | 0 | –1 1101011010 | 0 | 1 |
| F8 | 11111000 | 1111100101 | 2 | –1 0111100101 | –2 | –1 |
| F9 | 11111001 | 1111100111 | 2 | 1 0111100111 | –2 | 1 |
| FA | 11111010 | 1111101101 | 2 | 1 0111101101 | –2 | 1 |
| FB | 11111011 | 1111101111 | 2 | –1 0111101111 | –2 | –1 |
| FC | 11111100 | 1111111001 | 2 | 1 0111111001 | –2 | 1 |
| FD | 11111101 | 1111111011 | 2 | –1 0111111011 | –2 | –1 |
| FE | 11111110 | 1111111110 | 2 | –2 0111111110 | –2 | –1 |
| FF | 11111111 | 1111101010 | 2 | –1 0111101010 | –2 | –1 |
| Sync pattern | | 0100010001 | 0 | 1 1100010001 | 0 | 1 |

In the above table, 256 kinds of 8-bit data (0 to 255) are indicated in both of hexadecimal and binary representations. Ten-bit conversion codes (codewords) are indicated in a binary, NRZI representation. In the table, DC means a DC component of a 10-bit conversion code when the last bit of a left-adjacent 10-bit conversion code is at the L level (0). Further, shown in the bottom part of Table 6 are 10-bit sync patterns to be inserted at a prescribed position (timing) such as the head position of a frame, which patterns are not allocated to any 8-bit data.

In the above conversion table, the NRZI-represented 10-bit conversion data (codewords) have a minimum number of continuous 0's (minimum run) of 0 and a maximum number of continuous 0's (maximum run) of 3. One 8-bit data is allocated to two 10-bit conversion codes, which are classified by use of a variable Q' obtained by delaying, by one clock, a 1-bit variable Q that represents information on the DC component.

The 8–10 conversion using the above conversion table is performed as shown in FIG. 13. That is, not only the 8-bit data (datawords) but also Q' is input to a conversion table storage section 41 in which the conversion table is stored. The conversion table storage section 41 outputs one of the two 10-bit conversion codes (codewords) allocated to the input 8-bit data which one conversion code corresponds to the input Q'. The storage section 41 also outputs Q that represents information on the DC component of the above 10-bit conversion code.

Q is delayed by one clock by a D flip-flop (DFF) 42, and then input, as Q', to the conversion table 41 at the same timing as the next 8-bit data is supplied to the conversion table storage section 41.

The above operation is repeatedly performed.

The above 8–10 conversion processing will further be described in detail with reference to a timing chart of FIG. 14. It is assumed that a sync pattern, "11111111 (FFH)" and "11111111 (FFH)" are sequentially input (see FIG. 14(a)), and that Q having a value –1 (see FIG. 14(b)) was output from the conversion table storage section 41 immediately before the input of the sync pattern.

Q is delayed by the DFF 42, and then input, as Q' (=–1), to the conversion table storage section 41 together with the sync pattern. The conversion table storage section 41 outputs "0100010001" (see Table 6 and FIG. 14(c)) corresponding to Q'=–1 which code is one of the two 10-bit conversion codes (see Table 6) allocated to the sync pattern. The storage section 41 also outputs Q having a value 1 (see FIG. 14(b))

that represents information on the DC component of the above 10-bit conversion code.

Q thus output is delayed by the DFF 42, and then input, as Q' (=1), to the conversion table storage section 41 together with the 8-bit data "11111111 (FFH)" subsequent to the sync pattern. The conversion table storage section 41 outputs "0111101010" (see FIG. 14(c)) corresponding to Q'=1 which data is one of the two 10-bit conversion data (see Table 6) allocated to "11111111." The storage section 41 also outputs Q having a value −1 (see FIG. 14(b)) that represents information on the DC component of the above 10-bit conversion data.

Similarly, the next data "11111111 (FFH)" (see FIG. 14(a)) is converted to "1111101010" (see FIG. 14(c)).

FIG. 14(d) shows a recording current used when the 10-bit-unit codes obtained by the above conversion is NRZI-modulated and then recorded onto a magnetic tape, for instance. While the DC component of the 10-bit data "0111101010" obtained by converting the 8-bit data "11111111 (FFH)" subsequent to the sync pattern is 2, that of the 10-bit data "1111101010" obtained by converting the next 8-bit data "11111111 (FFH)" is −2. Therefore, the DC components cancel out each other to make the DC component of the entire recording current 0. As a result, the reproduction signal also has a DC component of 0.

By the way, when the codes which has been subjected to the above 8–10 conversion and the NRZI modulation is recorded onto a magnetic tape etc. by utilizing the intersymbol interference such as above-described Pr(1, 1) to improve the recording linear density, the number of continuous 0's in the 10-bit-unit code as produced by the above 8–10 conversion using Tables 1–6 is limited to 3 or less in the NRZI representation. Therefore, the number of continuously appearing same codes, i.e., continuous 1's or 0's in the NRZ-represented recording current shown in FIG. 12(c) is limited to 4 or less.

Therefore, the number of continuous 1's or −1's in the reproduction signal shown in FIG. 12(d) is limited to 3 or less (3 clocks or shorter).

However, since no limitation is imposed on the number of continuous 1's in the 10-bit-unit code as obtained by the 8–10 conversion, the number of continuously appearing "1, 0" sets or "0, 1" sets (for example, a portion indicated by R in FIG. 12(c)) is not limited in the NRZ-represented recording current shown in FIG. 12(c).

For example, since 8-bit data "11101011 (EBH)" is converted to 10-bit code "1111111111" (see Table 6), when the 8-bit data "11101011 (EBH)" are consecutively input, the NRZ-represented recording current is a series of "1, 0" sets or "0, 1" sets.

As described above in connection with FIG. 12(d), a "1, 0" set or a "0, 1" set in the NRZ-represented recording signal of FIG. 12(c) results in a reproduction signal of a value "0."

Therefore, continuous 1's in the 10-bit-unit code produced by the 8–10 conversion cause continuous 0's (among the ternary levels) in the reproduction signal obtained in a reproducing operation.

When the reproduction signal remains "0" for a long period, there may occur PLL unlocking, which disables correct clock generation and increases an error rate of the reproduced data. In the worst case, the data reproduction itself cannot be performed.

SUMMARY OF THE INVENTION

The present invention has been made in view of the above circumstances, and is intended to increase the data recording density and, at the same time, to enable correct data reproduction.

According to the present invention, a magnetic recording apparatus which converts m-bit-unit data to an n-bit-unit code (n>m) by block coding and records the converted code onto a recording medium such as a magnetic tape 1 by use of NRZI codes while utilizing intersymbol interference, is characterized in that the number of continuous 1's in a NRZI representation of the converted code is not more than 2n−2.

The above magnetic recording apparatus may be such that the converted code is a 10-bit-unit code obtained by converting 8-bit-unit data, and that its NRZI-represented data has a minimum run of 0 and a maximum run of 3.

The above magnetic recording apparatus may be such that the number of 1's included in NRZI-represented data of the 10-bit-unit converted code is not more than 9.

The above magnetic recording apparatus may be such that the number of 1's included in NRZI-represented data of the 10-bit-unit converted code is not more than 8.

Further, the above magnetic recording apparatus may be such that the intersymbol interference is that of Pr(1, 1).

In the magnetic recording apparatus having the above constitution, m-bit-unit data is converted to an n-bit-unit code (n>m), and the converted code is recorded onto the magnetic tape 1 by use of NRZI codes while the intersymbol interference is utilized. The number of continuous 1's in a NRZI representation of the converted code is made not more than 2n−2. As a result, the number of clocks associated with continuous 0 levels in a reproduction signal obtained from the magnetic tape 1 becomes not more than 2n−2 and, therefore, it can be prevented that a large error occurs in clocks generated from the reproduction signal in a reproducing operation.

BRIEF DESCRIPTION OF THE DRAWINGS

FIG. 9 illustrates magnetic recording without intersymbol interference;

FIG. 14 is a timing chart illustrating the 8–10 conversion.

DESCRIPTION OF THE PREFERRED EMBODIMENT

Figure 1:
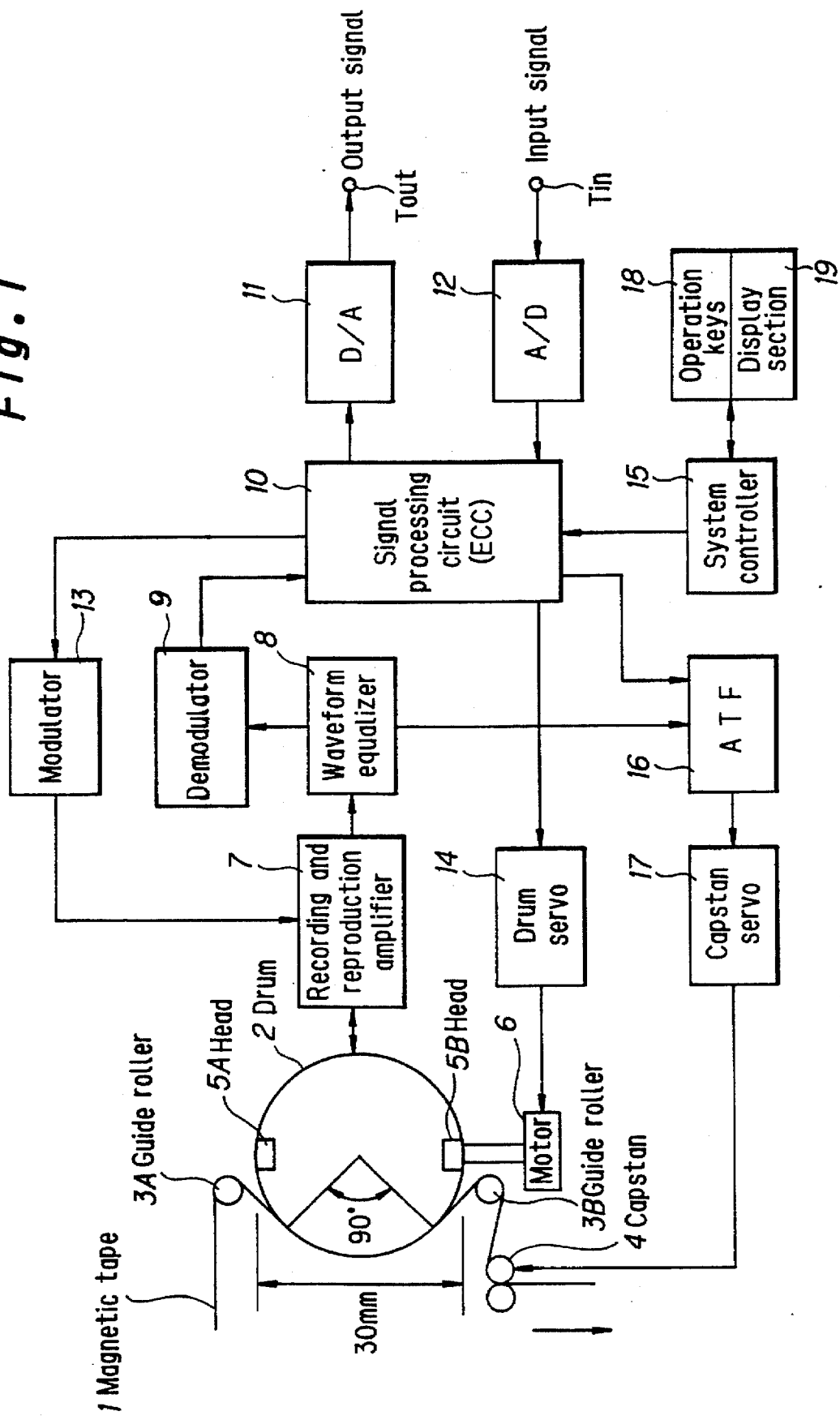
FIG. 1 is a block diagram showing an embodiment of a tape recorder to which a magnetic recording apparatus of the present invention is applied.

FIG. 1 is a block diagram showing an embodiment of a tape recorder to which a magnetic recording apparatus of the present invention is applied. A magnetic tape 1 is wound around a drum 2 of about 30 mm over a range of about 90° through guide rollers 3A and 3B. In a recording or reproducing operation, the magnetic tape 1 is run at a predetermined speed in the direction indicated by an arrow by a capstan 4 driven by a capstan motor (not shown) or the like.

The capstan motor drives the capstan 4 based on a servo signal supplied from a capstan servo circuit 17. The capstan servo circuit 17 is controlled by an ATF (automatic track finding) circuit 16. The ATF circuit 16 generates an ATF signal for tracking control based on signals sent from a waveform equalizer 8 and a signal processing circuit 10, and supplies the generated ATF signal to the capstan servo circuit 17.

(Rotary) magnetic heads 5A and 5B are provided on the inner side wall of the drum 2 so as to be opposed to each other with the rotation center of the drum located in between. When the drum 2 is rotated by a motor 6, the magnetic heads 5A and 5B alternately trace tracks on the magnetic tape 1 (described later).

The motor 6 rotates the drum 2 based on a servo signal supplied from a drum servo circuit 14. The drum servo circuit 14 incorporates an error correction circuit (ECC), and is controlled by the signal processing circuit 10 which performs prescribed signal processing.

Recording to and reproduction from the magnetic tape 1, and its fast feed, rewind, stop, etc. are effected when operation keys 18 are operated. That is, when one of the operation keys is operated, a system controller 15 controls the respective blocks of the apparatus so that an action corresponding the operation is effected. The operating state (under reproduction, under rewinding, etc.) and other information (present time, remainder of the tape 1, etc.) are displayed on a display section 19 with control by the system controller 15.

In a recording operation, data to be recorded, for instance, an analog signal such as a video signal or an audio signal, is input through an input terminal $T_{in}$ to an A/D converter 12, where it is converted to a digital signal. The digital signal is input to the signal processing circuit 10, where it is converted to data with a format suitable for the apparatus.

Where original data to be recorded is a digital signal, it can directly be input to the signal processing circuit 10.

Figure 2:
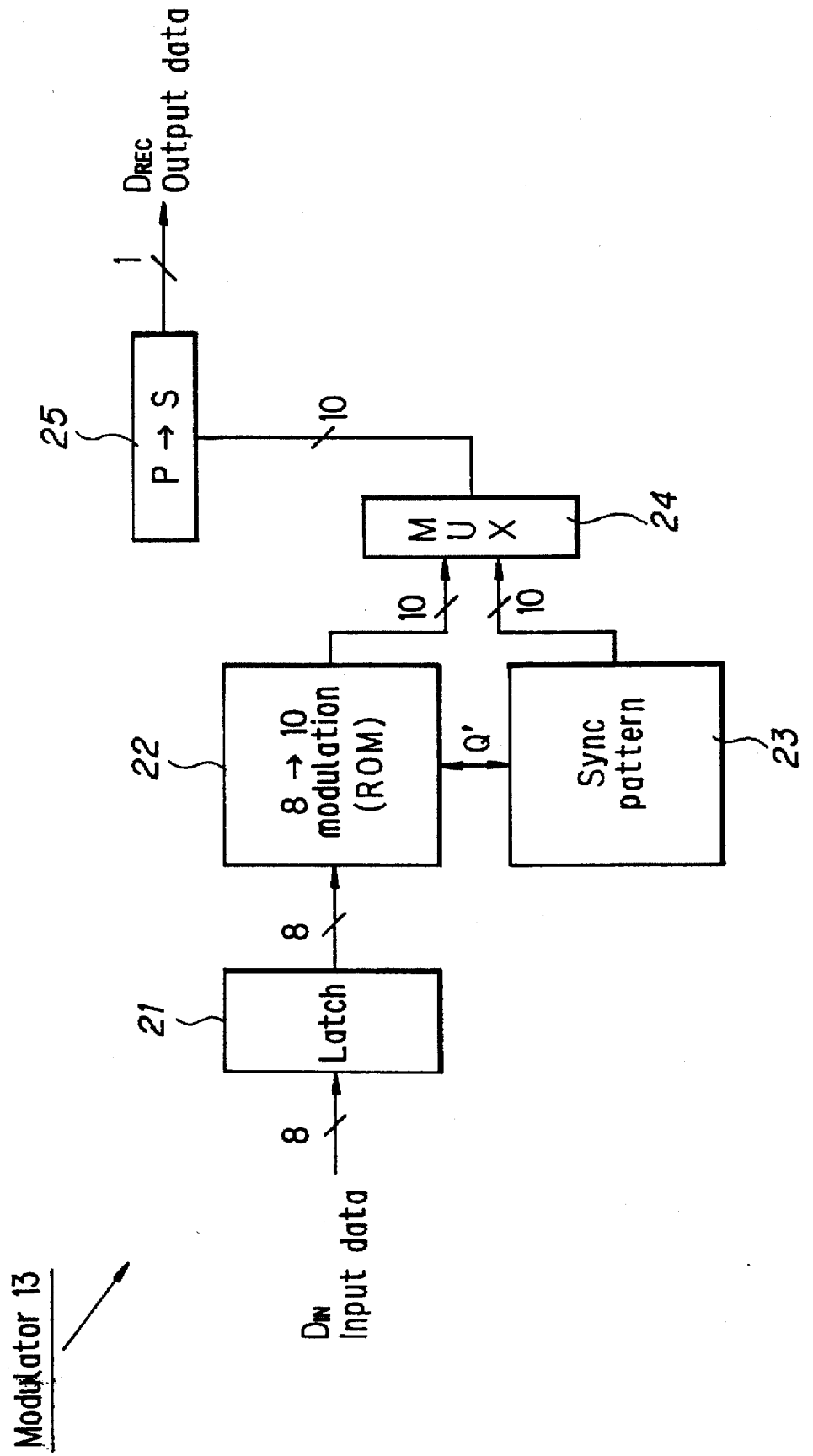
FIG. 2 is a more detailed block diagram of a modulator 13 in the embodiment of FIG. 1.

The data which has been rendered into the prescribed format by the signal processing circuit 10 is input, in the form of 8-bit units, for instance, to a modulator 13. Constituted as shown in FIG. 2, for instance, the modulator 13 modulates the received 8-bit-unit data.

Figure 13:
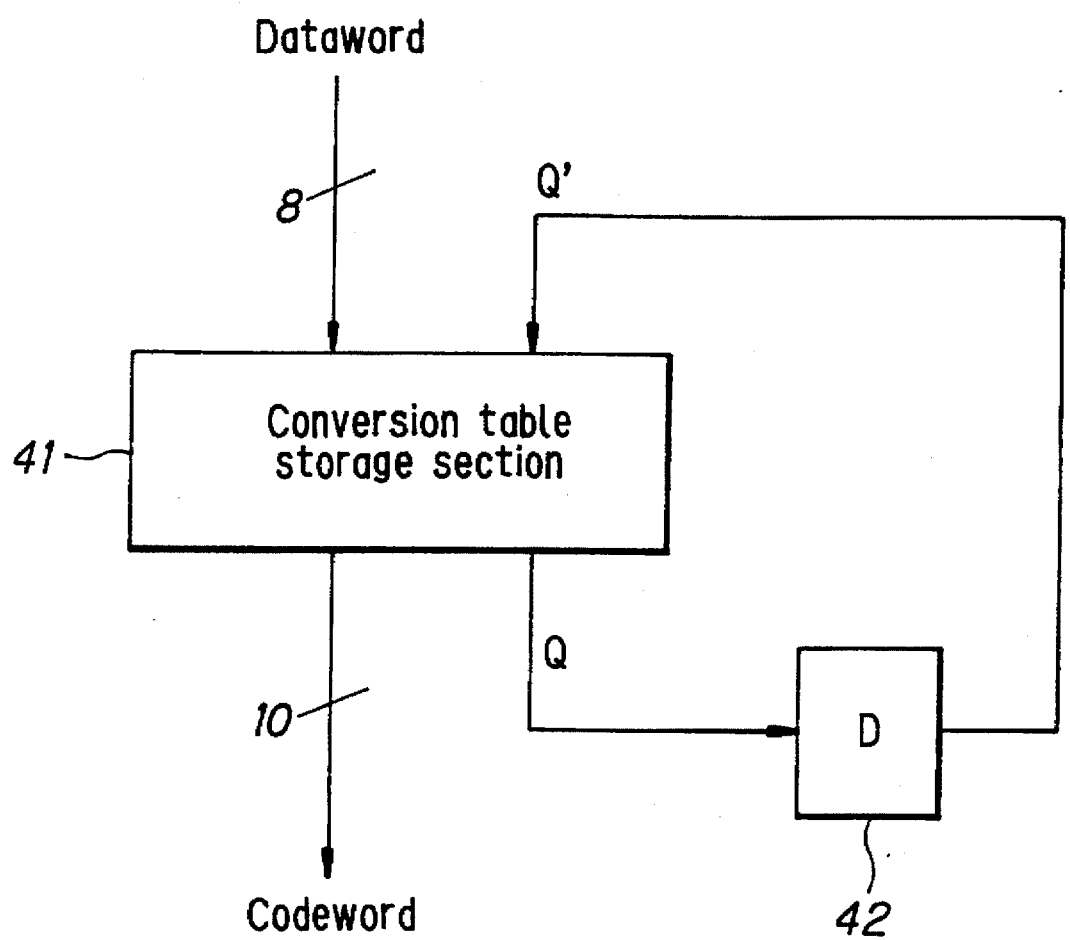
FIG. 13 illustrates a 8–10 conversion method.

More specifically, in the modulator 13, 8-bit-unit data $D_{IN}$ sent from the signal processing circuit 10 is latched by a latch circuit 21, and then input to an 8→10 modulator 22 that is constituted of a ROM. Stored with a conversion table (described later), the 8→10 modulator 22 outputs, as a modulated code, 10-bit data that is stored at an address indicated by the received 8-bit data to a multiplexer (MUX) 24. The 8-10 conversion in the 8→10 modulator 22 is performed as described above in connection with FIG. 13.

In addition to the modulation codes sent from the 8→10 modulator 22, a 10-bit sync pattern generated by a sync pattern generator 23 is supplied to the multiplexer 24 at a predetermined timing. The multiplexer 24 outputs the sync pattern at the timing of sync pattern reception, and outputs the modulation codes at the other timings.

The 10-bit-parallel modulation codes (hereinafter the term "modulation code" includes the sync pattern) as output from the MUX 24 is input to a parallel-to-serial (P→S) converter 25, where it is converted to serial data. The serial data is input to a recording and reproduction amplifier 7 (see FIG. 1) as recording data $D_{REC}$.

Figure 12:
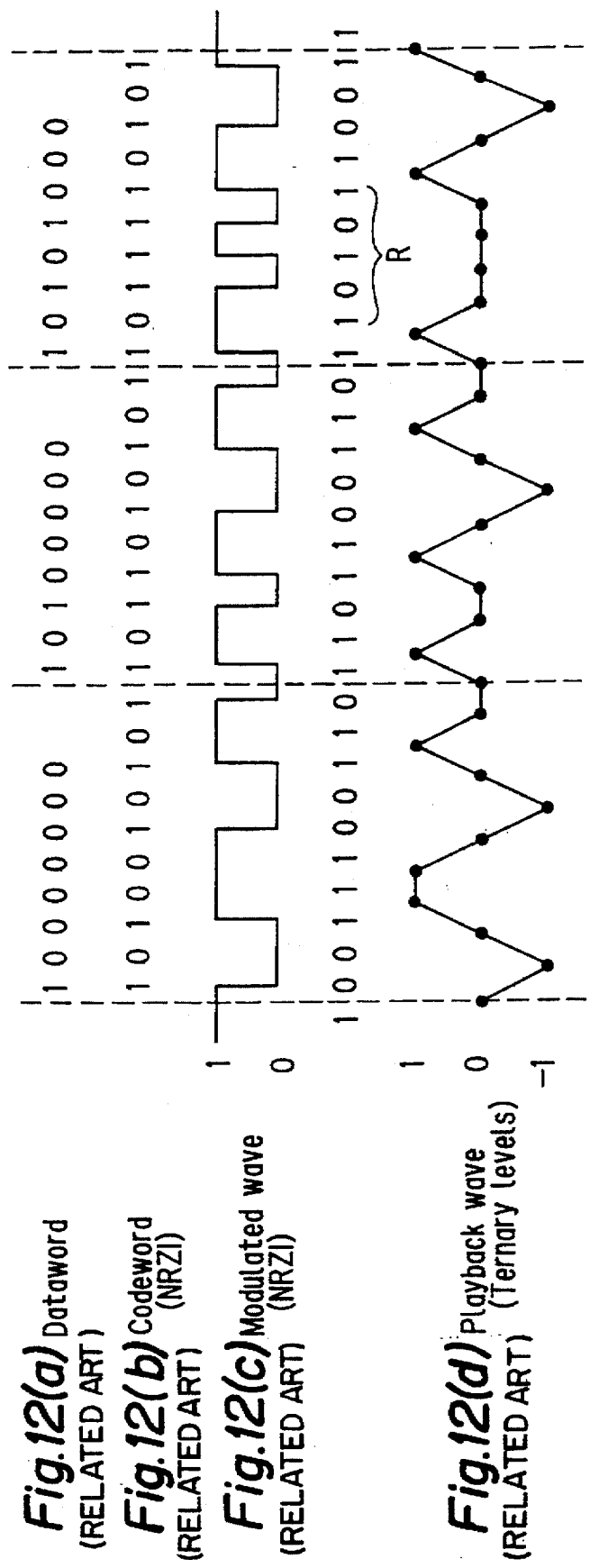
FIG. 12 illustrates magnetic recording and reproduction using Pr(1, 1)

The recording and reproduction amplifier 7 (see FIG. 1) amplifies the recording data $D_{REC}$ sent from the modulator 13 (P→S converter 25), and supplies the amplified data to the magnetic heads 5A and 5B as a recording current. A magnetic field corresponding to the recording current is generated in a head gap of each of the magnetic heads 5A and 5B, and the magnetic tape 1 is magnetized accordingly In the above manner, the data recording is performed so as to cause, in a reproducing operation, intersymbol interference of Pr(1, 1) described above in connection with FIG. 12.

Figure 3:
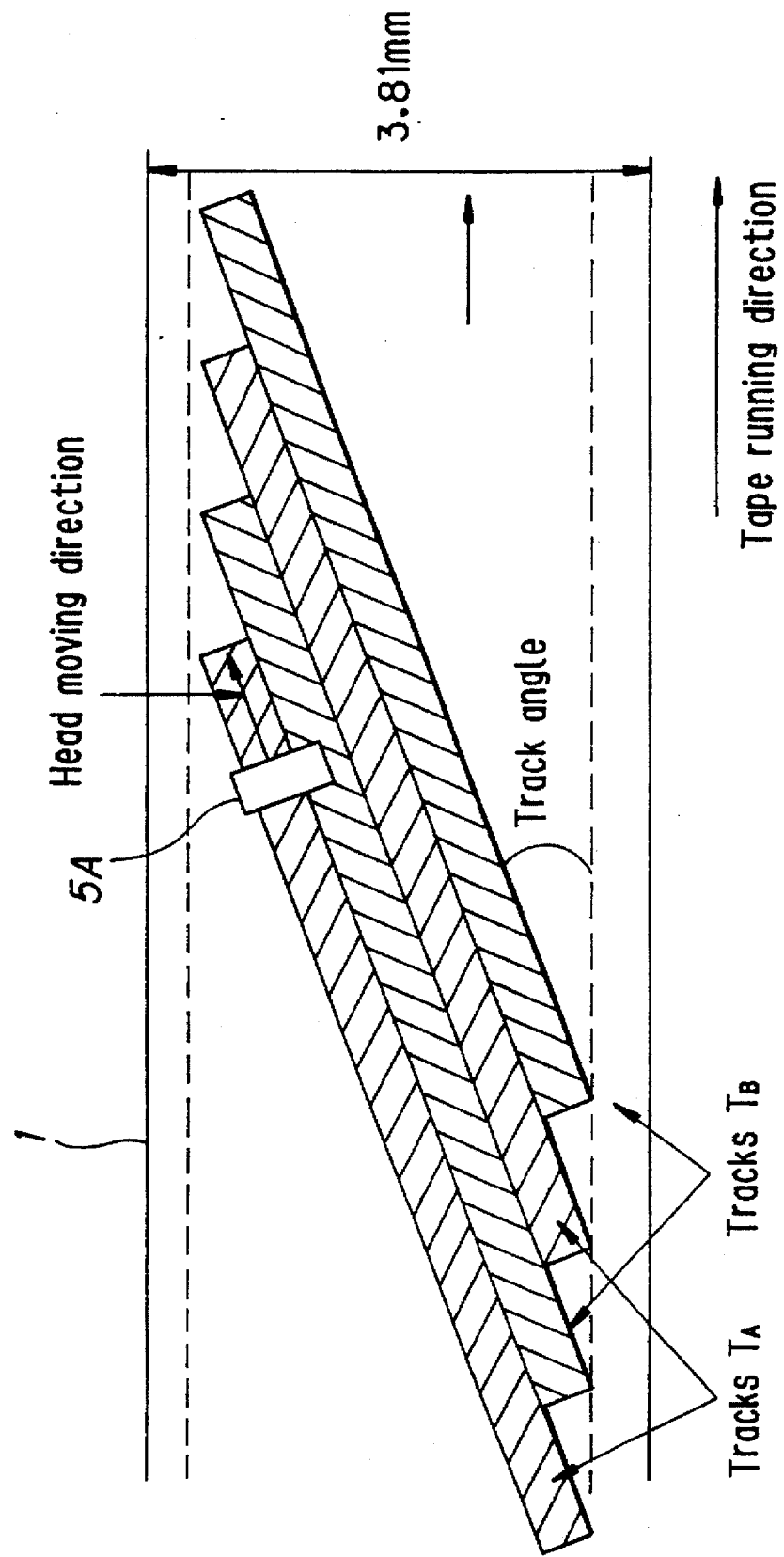
FIG. 3 illustrates tracks formed on a magnetic tape 1 in the embodiment of FIG. 1.

As shown in FIG. 3, the magnetic tape 1 has a width of about 3.81 mm, and tracks are formed on the magnetic tape 1 so as to incline from the longitudinal (running) direction by a predetermined track angle (e.g., about 6°). Tracks $T_A$ are traced by the magnetic head 5A, and tracks $T_B$ which are interlaced with the tracks $T_A$ are traced by the magnetic head 5B. That is, each of the magnetic heads 5A and 5B traces every other track.

Figure 4:
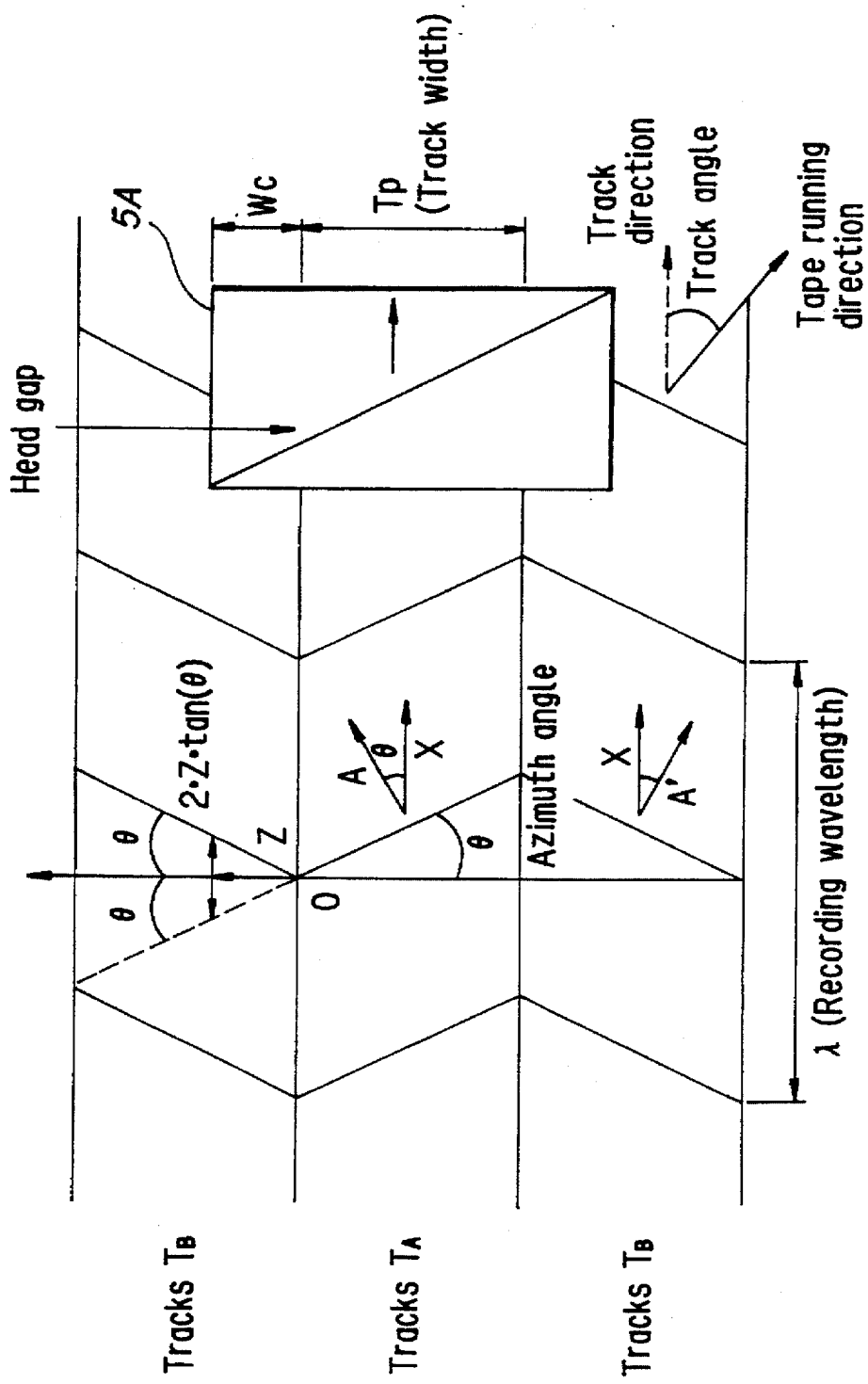
FIG. 4 illustrates azimuth recording.

To increase the recording density, the data recording onto the magnetic tape 1 is performed by the azimuth recording scheme. That is, as shown in FIG. 4, a track pitch $T_P$ is made smaller than the width of the head 5A (or head 5B) such that the head 5A projects by $W_C$ on both sides, which contributes to increase of the track density. Further, the head 5A magnetizes the track $T_A$ in a direction A that inclines from a track direction X of the track $T_A$ by a predetermined azimuth angle θ (e.g., about 20°).

The head 5B (not shown in FIG. 4) magnetizes the track $T_B$, which adjoins the track $T_A$ that is traced by the head 5A, in a direction A' that inclines from a track direction X of the track $T_B$ by a predetermined azimuth angle −θ.

That is, the track $T_A$ (or $T_B$) is magnetized by the head 5A (or 5B) that is wider than the track pitch $T_P$ in the direction deviated by 2θ from the direction in which the adjacent track $T_B$ (or $T_A$) is magnetized. This will cause an azimuth effect, so that crosstalk is reduced and a reproduction signal of a sufficient magnitude can be obtained even if some deviation occurs in the tracking.

Returning to FIG. 1, in a reproducing operation, the magnetic tape 1 is traced by the magnetic heads 5A and 5B, and a reproduction signal (current) including intersymbol interference of Pr(1, 1) is input to the recording and reproduction amplifier 7. The recording and reproduction amplifier 7 amplifies the reproduction signal, and supplies the amplified signal to a waveform equalizer 8. Consisting, for instance, of an integrator and a filter (LPF) (both not shown), the waveform equalizer 8 integrates the reproduction signal having features of a differentiated signal, equalizes its waveform, and supplies the resulting signal to a demodulator 9. Thus, the demodulator 9 receives a reproduction signal of ternary values involving intersymbol interference of Pr(1, 1) (see FIG. 12(d)).

Figure 5:
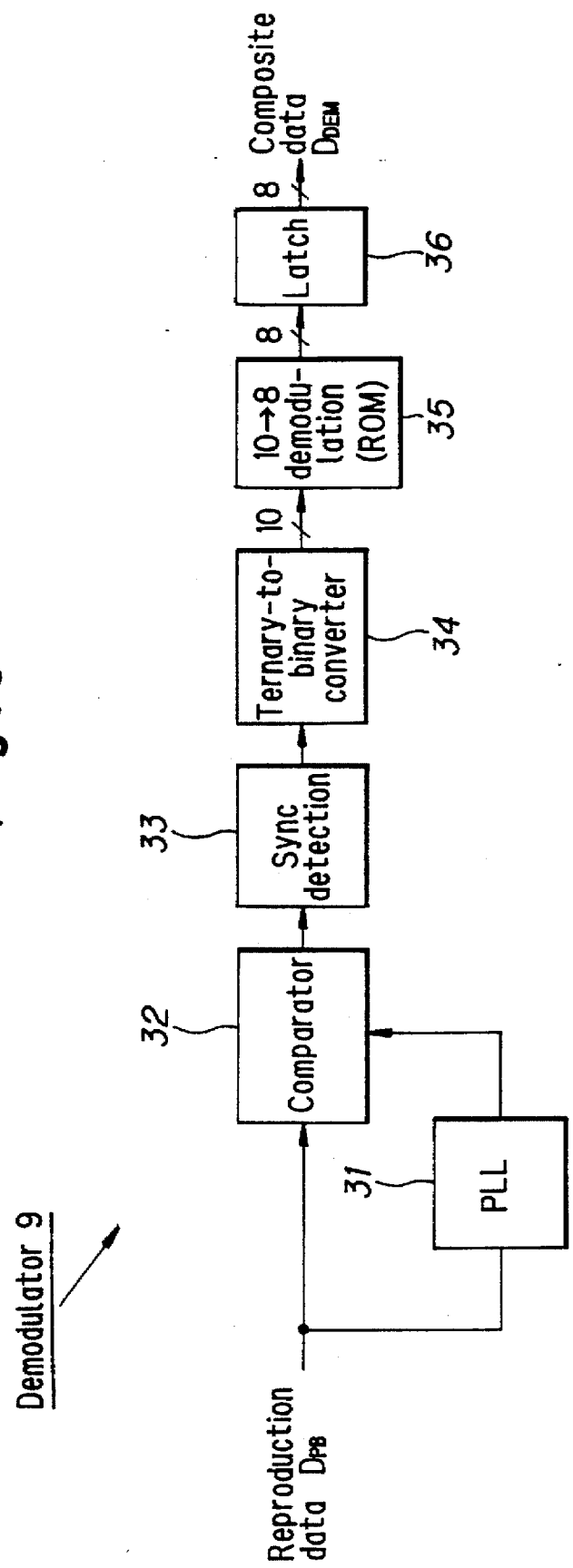
FIG. 5 is a more detailed block diagram of a demodulator 9 in the embodiment of FIG. 1.

Constituted as shown in FIG. 5, for instance, the demodulator 9 demodulates the reproduction signal (reproduction data $D_{PB}$) as output from the waveform equalizer 8. More specifically, in the demodulator 9, the reproduction signal is supplied to a comparator 32 as well as to a PLL circuit 31. The PLL circuit 31 generates clocks whose frequency has been controlled so as to eliminate a phase error from the reproduction signal, and supplies the clocks to the comparator 32.

The comparator 32 compares the reproduction signal with three levels of "1," "0" and "−1" at timings of the clocks sent from the PLL circuit 31, and supplies results of the comparison ("1," "0" or "−1") to a sync detector 33.

The sync detector 33 extracts a sync pattern from a data sequence (i.e., the reproduction signal consisting of three values of "1," "0" and "−1") as output from the comparator 32. The sync detector 33 supplies the extracted sync pattern to a processing circuit (not shown), and the remaining data sequence (reproduction signal) to a ternary-to-binary converter 34.

In the ternary-to-binary converter 34, the ternary reproduction signal is converted to a binary signal according to an algorithm that is reverse to the above-described algorithm for obtaining the reproduction signal of FIG. 12(d) from the NRZ-represented recording current of FIG. 12(c). Further, the binary signal thus obtained is then converted to 8–10 converted, NRZI-represented data according to an algorithm that is reverse to the algorithm for obtaining the NRZ-represented recording current of FIG. 12(c) from the NRZI-modulated data of FIG. 12(b).

The resulting data is input, in the form of 10-bit units, to a 10→8 demodulator 35 constituted of a ROM, for instance.

The 10→8 demodulator 35 is stored with a conversion table to be used for a conversion that is reverse to the 8–10 conversion using the conversion table stored in the 8→10 modulator 22 of the modulator 13 shown in FIG. 2. And the 10→8 demodulator 35 supplies, as demodulated data, 8-bit data stored at an address indicated by the received 10-bit code to a latch circuit 36. The latch circuit 36 latches the 8-bit-unit demodulation data sent from the 10→8 demodulator 35, and then supplies it to the signal processing circuit 10 (see FIG. 1).

The signal processing circuit 10 (see FIG. 1) performs error detection and correction processing and other prescribed processing on the demodulated data sent from the demodulator 9, and supplies the processed data to a D/A converter 11. The D/A converter 11 D/A-converts the demodulated data, and supplies the resulting data to the subsequent circuit (not shown) as an output signal $T_{OUT}$.

Next, a detailed description will be made of the conversion table stored in the 8→10 modulator 22 of the modulator 13 (see FIG. 2), which table is the essential feature of the invention. As described above, where the codes that have been 8–10 converted and NRZI-modulated by utilizing the intersymbol interference of Pr(1, 1), for instance, are recorded, if there is no limitation on the number of continuous 1's in those codes, a limitless number of 0's may appear in the reproduction signal, which likely causes unlocking in the PLL circuit 31 (see FIG. 5) to lower the stability of the apparatus.

To solve the above problem, in the conversion table stored in the 8→10 modulator 22, the 10-bit codes satisfy the conditions of the conventional conversion table (hereinafter called "conventional conditions") and, in addition, each NRZI-represented 10-bit code includes at least one "0."

In the following description, it is assumed that the 10-bit code is NRZI-represented until otherwise specified.

More specifically, in the conversion table stored in the 8→10 modulator 22, the 8-bit data "11101011 (EBH)" (see Table 6), which is conventionally converted to the 10-bit code "1111111111" included in the conversion table of Tables 1–6, is not converted to "1111111111" but to one of 1,024 kinds of 10-bit codes which one code is not allocated to the other 8-bit data, satisfies the conventional conditions, and includes at least one "0" (for instance, "0111001011").

In this case, in the codes output from the modulator 13 (see FIG. 1), the largest number of continuous 1's occurs when the two 10-bit codes "0111111111" and "1111111110"

come consecutively. (Where the m-bit-unit data is converted to the n-bit-unit code (n>m), the largest number of continuous 1's occurs when there come consecutively a code having the head bit of 0 and n−1 continuous 1's following it and a code having n−1 continuous 1's including the head bit and the last bit of 0.) Therefore, even in the worst case, 0's do not consecutively appear in the reproduction signal for a period exceeding 18 (=2×10−2) clocks (2n−2 clocks where the m-bit-unit code is converted to the n-bit-unit data (n>m)).

Therefore, it can be prevented that the PLL circuit 31 (see FIG. 5) is unlocked for a long period.

By the way, as described above, where the conversion table is used in which "1111111111" is replaced by 10-bit code including at least one "0," a reproduction signal corresponding to 8–10 converted 10-bit code of the worst case ("0111111111" or "1111111110") has continuous 0's of 9 clocks.

In view of the above, a description will be made of the configuration of a conversion table with which 0's consecutively appear in the reproduction signal corresponding to the 8–10 converted 10-bit code only for a period shorter than 9 clocks.

A reproduction signal corresponding to 8–10 converted 10-bit code including two or more 0's has continuous 0's of less than 9 clocks. In the conversion table of Tables 1–6, the number of 10-bit codes (part of 1,024 kinds of 10-bit data; hereinafter called "replacement codes") that have not been allocated to any 8-bit data, satisfy the conventional conditions, and includes two or more 0's is 15, are listed as NRZI-represented codewords in Table 8 (described later).

On the other hand, in the conventional conversion table shown in Tables 1–6, when the NRZI-represented 10-bit codes are classified in terms of the number of 0's included, only one code belongs to a set of 10-bit codes not including "0," and 11 codes belong to a set of 10-bit codes including one or no "0." Further, the number of codes belonging to a set of 10-bit codes including two or less 0's is larger than 15, which is the number of replacement codes.

Therefore, among the sets obtained by the classification in terms of the number of 0's included, each of the set of 10-bit codes not including "0" and the set of 10-bit codes including one or no "0" can be fully replaced by the above-described replacement codes. But the set of 10-bit codes including two or less 0's cannot be fully replaced by the replacement codes.

In consideration of the above, 11 codes belonging to the set of 10-bit codes including one or no "0" are replaced by the replacement codes, to produce a conversion table consisting of 10-bit codes including two or more 0's, i.e., including not more than 8 1's.

That is, as shown in Table 7, the conventional conversion table of Tables 1–6 have 11 10-bit codes (codewords) in which the number of 0's included is one or zero.

TABLE 7

| Old-table | | Q' = −1 | | | Q' = 1 | | |
|---|---|---|---|---|---|---|---|
| | Dataword | Codeword | DC | Q | Codeword | DC | Q |
| 2B | 00101011 | 0111111111 | 0 | 1 | 0111111111 | 0 | −1 |
| AB | 10101011 | 1011111111 | 2 | −1 | 0011111111 | −2 | −1 |
| B3 | 10110011 | 1101111111 | 0 | 1 | 1101111111 | 0 | 1 |
| CB | 11001011 | 1110111111 | 2 | −1 | 0110111111 | −2 | −1 |
| E3 | 11100011 | 1111011111 | 0 | 1 | 1111011111 | 0 | −1 |
| E9 | 11101001 | 1111110111 | 0 | 1 | 1111110111 | 0 | −1 |
| EA | 11101010 | 1111111101 | 0 | 1 | 1111111191 | 0 | −1 |
| EB | 11101011 | 1111111111 | 0 | −1 | 1111111111 | 0 | 1 |

TABLE 7-continued

| Old-table | | Q' = −1 | | | Q' = 1 | | |
|---|---|---|---|---|---|---|---|
| | Dataword | Codeword | DC | Q | Codeword | DC | Q |
| FB | 11111011 | 1111101111 | 2 | −1 | 0111101111 | −2 | −1 |
| FD | 11111101 | 1111111011 | 2 | −1 | 0111111011 | −2 | −1 |
| FE | 11111110 | 1111111110 | 2 | −1 | 0111111110 | −2 | −1 |

A conversion table for the 8–10 conversion is formed by replacing, respectively, the above 11 10-bit codes with a certain combination of 11 codes of the existing 15 10-bit codes including not more than 8 1's, as shown in Table 8. (In Table 8, there are used the top 11 codes of the existing 15 10-bit codes including not more than 8 1's.)

TABLE 8

| New-table | | Q' = −1 | | | Q' = 1 | | |
|---|---|---|---|---|---|---|---|
| | Dataword | Codeword | DC | Q | Codeword | DC | Q |
| 2B | 00101011 | 0010011001 | 2 | 1 | 1010011001 | −2 | 1 |
| AB | 10101011 | 0010011011 | 2 | −1 | 1010011011 | −2 | −1 |
| B3 | 10110011 | 0010011110 | 2 | −1 | 1010011110 | −2 | −1 |
| CB | 11001011 | 1100100011 | 2 | −1 | 0100100011 | −2 | −1 |
| E3 | 11100011 | 1100100110 | 2 | −1 | 0100100110 | −2 | −1 |
| E9 | 11101001 | 0100110010 | 2 | 1 | 1100110010 | −2 | 1 |
| EA | 11101010 | 0111001001 | 0 | 1 | 0111001001 | 0 | −1 |
| EB | 11101011 | 0111001011 | 0 | −1 | 0111001011 | 0 | 1 |
| FB | 11111011 | 0111001110 | 0 | −1 | 0111001110 | 0 | 1 |
| FD | 11111101 | 0110100011 | 2 | −1 | 1110100011 | −2 | −1 |
| FE | 11111110 | 0110100110 | 2 | −1 | 1110100110 | −2 | −1 |
| | | 1110110010 | 2 | 1 | 0110110010 | −2 | 1 |
| | | 0011100011 | 2 | −1 | 1011100011 | −2 | −1 |
| | | 0011100110 | 2 | −1 | 1011100110 | −2 | −1 |
| | | 1011110010 | 2 | 1 | 0011110010 | −2 | 1 |

By constituting the conversion table in the above manner, the reproduction signal corresponding to the 8–10 converted 10-bit codes does not include continuous 0's of 9 clocks even in the worst case, that is, 4 includes continuous 0's of 8 clocks even in the worst case. Therefore, the error in the clocks output from the PLL circuit 31 (see FIG. 5) can be reduced to further improve the stability of the apparatus.

Table 9 shows an example of setting of various parameters in the case where the above-constituted conversion table is used.

TABLE 9

| Tmin | Tmax | Tmax/Tmin | Tw | λmin | λmax | DC Component |
|---|---|---|---|---|---|---|
| 0.8T | 3.2T | 4 | 0.8T | 0.67 | 2.66 | free |

T: Time interval of one data bit. 0.8T equals Tch.
Tmin: Minimum time interval between transitions
Tmax: Maximum time interval between transitions
Tw: Detection window
λmin: Minimum wave length (μm)
λmax: Maximum wave length (μm)

In the above example, it is intended to increase the area (linear) recording density while considering a balance with, for instance, a variation of the DC component included in the reproduction signal by making $T_{max}/T_{min}$, i.e., $\lambda_{max}/\lambda_{min}$ ((maximum recording wavelength)/(minimum recording wavelength)) approximately equal to 4. Further, the DC free is realized while a consideration is made of a balance with, for instance, the error in the reproduction signal by making a window width (detection window width) $T_W$ relatively large.

Figure 6:
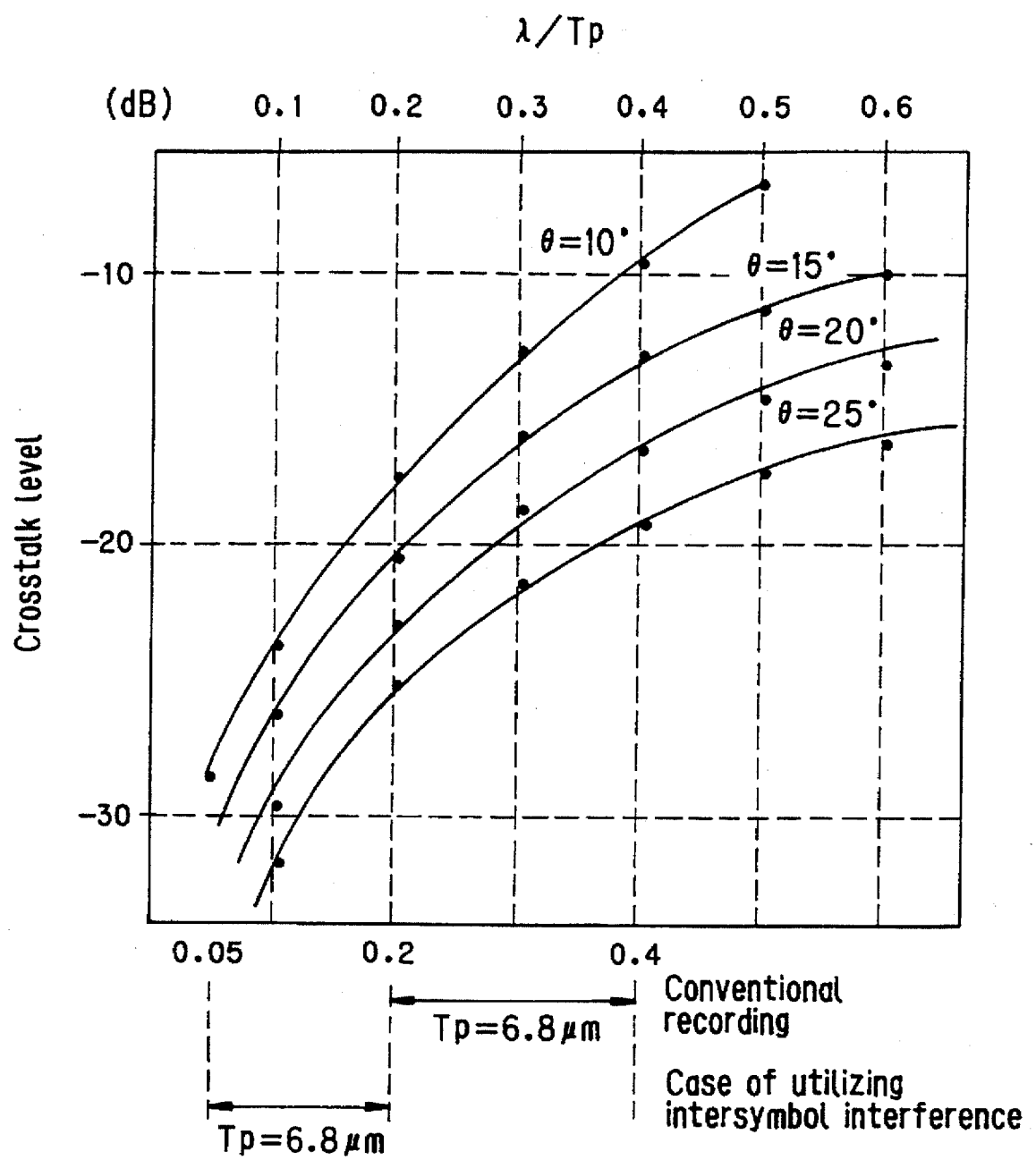
FIG. 6 is a graph showing a relationship between a crosstalk level and (recording wavelength)/(track pitch)

FIG. 6 shows a relationship between a crosstalk level and $\lambda/T_P$ ((recording wavelength)/(track pitch)) for cases where the azimuth angle ±θ of the magnetic heads 5A and 5B of the tape recorder shown in FIG. 1 is ±10°, ±15°, ±20° and ±25°. In FIG. 6, the vertical and horizontal axes represent the crosstalk level and $\lambda/T_P$, respectively.

A consideration will be made of differences between cases where the intersymbol interference is utilized and not utilized, for the azimuth angle ±θ of ±20°, for instance.

First, where the intersymbol interference is not utilized (the case of the conventional recording), if the track pitch $T_P$ is reduced from the conventional value of 13.6 μm to a half value of 6.8 μm, the crosstalk level, which should be less than −20 dB, becomes −16 dB in the worst case, in which case the detection error rate due to the crosstalk exceeds an allowable range. That is, where the azimuth recording is performed without utilizing the intersymbol interference, the azimuth effect lowers for a longer wavelength, so that the crosstalk possibly exceeds the allowable range. Therefore, the track pitch $T_P$ cannot be reduced.

On the other hand, where the intersymbol interference is utilized as in the case of the invention (the case of utilizing the intersymbol interference), even if the track pitch $T_P$ is reduced from the conventional value of 13.6 μm to a half value of 6.8 μm, the crosstalk level exists in an approximate range of −30 to −23 dB. It is understood that the recording density can be increased with the crosstalk level in a sufficiently practical range.

Figure 7:
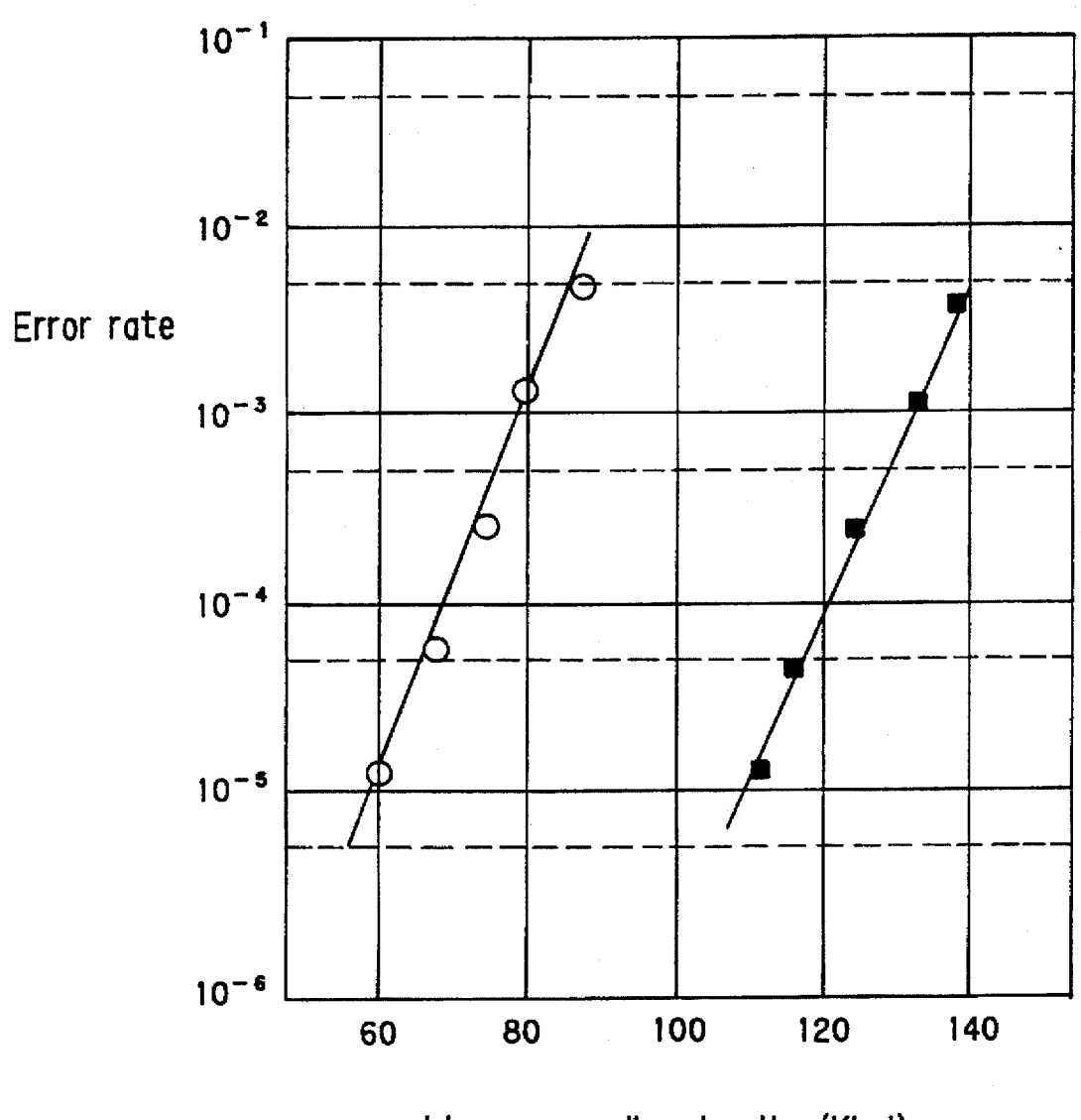
FIG. 7 shows a relationship between an error rate and a linear recording density.

FIG. 7 shows a relationship between the linear recording density and the data error rate. In FIG. 7, the vertical and horizontal axes represent the error rate and the linear recording density, respectively.

It is understood from FIG. 7 that where the intersymbol interference is utilized (the case of 8–10 conversion plus intersymbol interference; indicated by marks ■ in FIG. 7) as in the case of this embodiment, a high linear recording density which is close to two times a linear recording density of the case not utilizing the intersymbol interference (the case of the conventional recording scheme; indicated by marks ○ in FIG. 7) can be attained while the same error rate is maintained. This allows the data rate in the recording operation to be made approximately two times that of the conventional recording scheme. It is understood that where the recording density is kept the same, the data error rate in the reproducing operation can be reduced.

As described above, the high frequency band of the recording current and the reproduction signal is limited by utilizing the intersymbol interference, and the low frequency band is limited by converting the 8-bit-unit data to the 10-bit-unit codes in which there is no DC component or DC components cancel out each other. That is, the short wavelength recording is performed in the recording operation. In the reproducing operation, a wavelength range of the reproduction signal in which the output level is reduced due to the short wavelength recording is shifted to a longer wavelength range by the intersymbol interference, and the multi-value, i.e., ternary detection is performed. Therefore, where the azimuth recording is performed, the recording density can be increased without deteriorating the data error rate due to the crosstalk.

Further, since the 8-bit data is converted to 10-bit code in which, in the NRZI representation, the minimum number of continuous 0's is 0, the maximum number of continuous 0's is 3, and not more than 8 1's are included, stable clocks can be obtained.

Although the above description is directed to the case where the magnetic recording apparatus of the invention is applied to the tape recorder, the invention can be applied to magnetic information recording apparatuses other than the tape recorder, such as a magneto-optical disk apparatus.

Although in the above embodiment reproduction is performed with intersymbol interference of Pr(1, 1) and ternary detection is employed, the invention is not limited to this case. For example, other types of intersymbol interference can be utilized such as Pr(1, 0, −1) with which the reproduction is performed by 5-value detection.

Figure 8A:
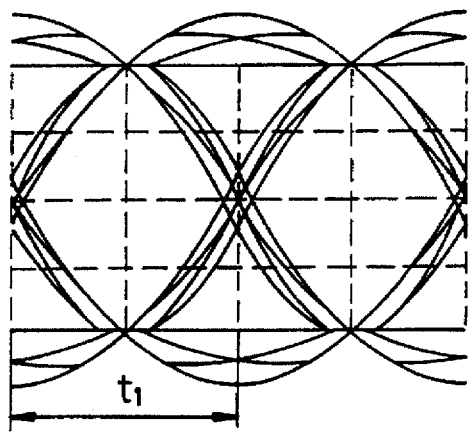
FIGS. 8(a)–8(c) show eye patterns.
Figure 8B:
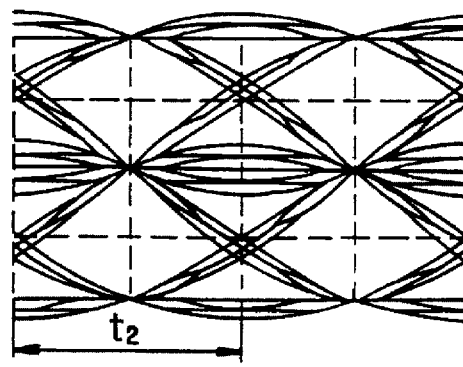
Figure 8C:
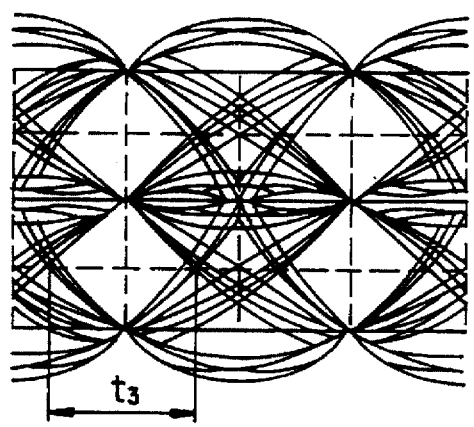
Figure 10:
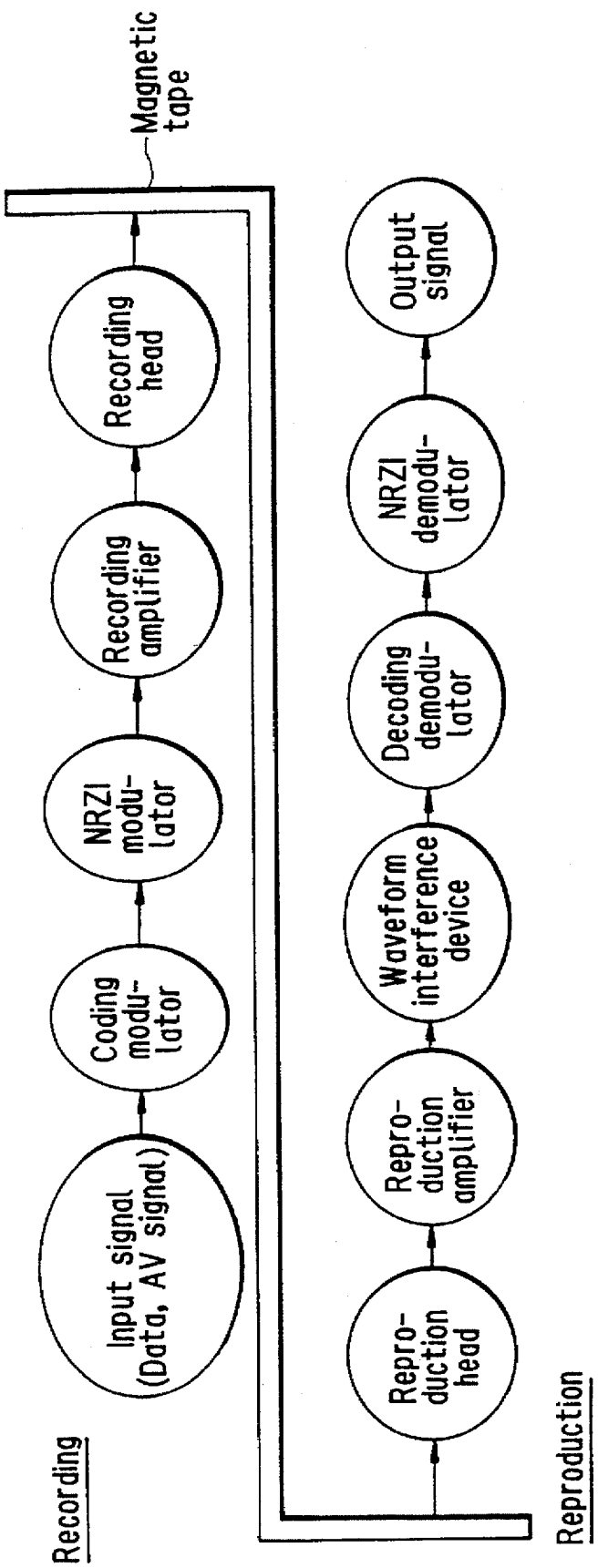
FIG. 10 shows a magnetic recording and reproduction scheme utilizing the intersymbol interference.
Figure 11:
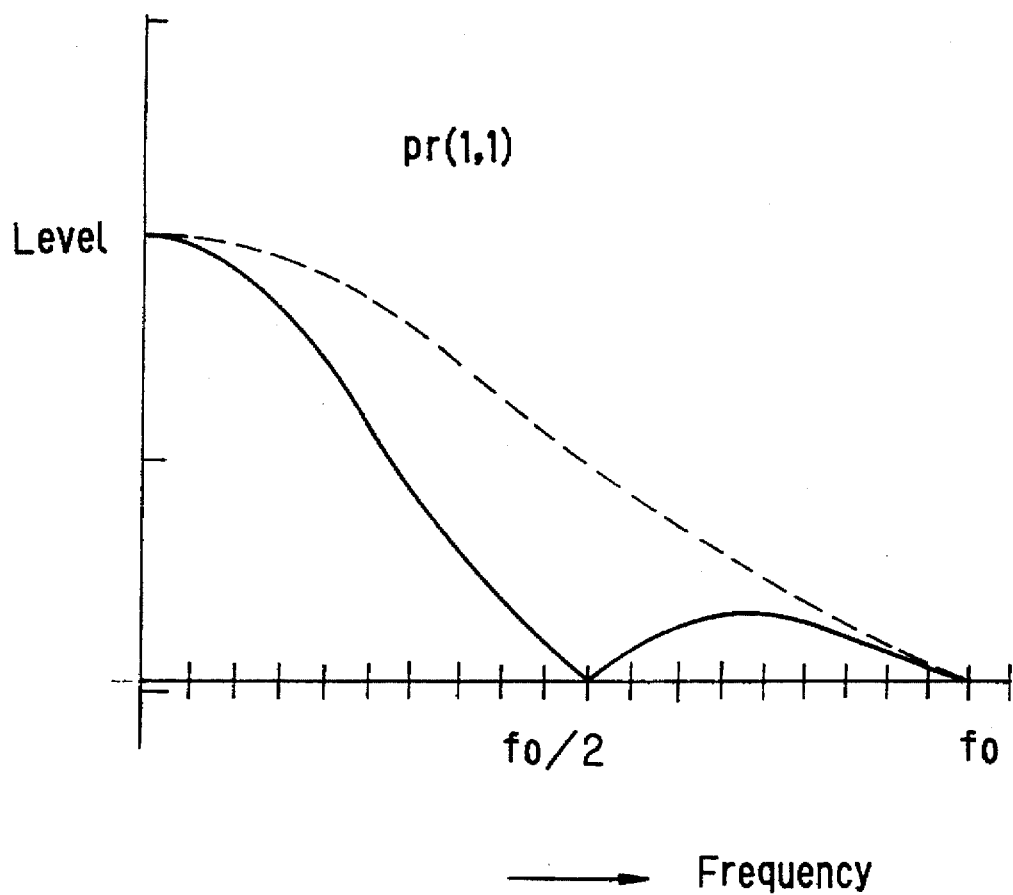
FIG. 11 is a graph showing a frequency characteristic of Pr(1, 1)

However, where Pr(1, 0, −1) is employed, the reproduction signal needs to have a large output in a high frequency band as in the case of not utilizing the intersymbol interference. Further, Pr(1, 0, −1) has an eye pattern as shown in FIG. 8(c) in which the detection window has a smaller width than that of an eye pattern of the case not utilizing the intersymbol interference shown in FIG. 8(a). More specifically, if the detection window width of the eye pattern of Pr(1, 0, −1) and that of the case not utilizing the intersymbol interference are denoted by $t_3$ and $t_1$, respectively, $t_3$ is approximately 0.7 times $t_1$.

On the other hand, as described above, where Pr(1, 1) is employed, it suffices that the reproduction signal has an output level that is approximately a half of that of the case not utilizing the intersymbol interference. Further, an eye pattern of Pr(1, 1), which is as shown in FIG. 8(b), has a detection width whose width is as large as that of the case not utilizing the intersymbol interference (see FIG. 8(a)). That is, if the detection window width of the eye pattern of Pr(1, 1) is denoted by $t_2$, $t_2$ is approximately the same as $t_1$.

Therefore, where Pr(1, 0, −1) is employed, not only the reproduction signal needs to have a large output in a high frequency band than the case of employing Pr(1, 1), but also the detection window width $t_3$ is smaller, i.e., approximately 0.7 times the detection window width $t_2$ of Pr(1, 1), which increases data detection errors in the reproducing operation.

The above discussion leads to the conclusion that Pr(1, 1) is preferable to Pr(1, 0, −1).

Although the above embodiment of the invention is directed to the case of using the 8–10 conversion, the invention is not limited to this case, but applicable to the general case where m-bit-unit data is converted to n-bit-unit code (n>m).

Although in the above embodiment (0, 4; 8, 10; 1) codes are used as (d, k; m, n; r) codes in the block coding, the invention is not limited to this case.

Further, although in the above embodiment the decoding is effected by performing level detection on the reproduction signal, the data decoding can be maximum likelihood decoding such as the Viterbi decoding. Where the number of clocks of continuous 0's in the reproduction signal corresponding to the 10-bit codes is made not more than 8 as described above and the Viterbi decoding is performed, the data determination can be assured within the original data length, i.e., 8 bits.

As described above, in the magnetic recording apparatus according to the invention, m-bit-unit data is converted to n-bit-unit code (n>m), and the converted code is recorded onto a recording medium by use of NRZI codes while the intersymbol interference is utilized. The number of continuous 1's in a NRZI representation of the converted code is made not more than 2n−2. As a result, the number of clocks associated with continuous 0 levels in a reproduction signal obtained from the recording medium becomes not more than 2n−2 and, therefore, it can be prevented that a large error occurs in clocks generated from the reproduction signal in a reproducing operation.

What is claimed is:

1. A method for converting a plurality of 8 bit input signals into a plurality of 10 bit output signals for use in a signal recording system, comprising the steps of:

receiving said plurality of 8 bit input signals; and converting each of said 8 bit input signals into a 10 bit output signal, wherein each of said 10 bit signals has less than 4 consecutive zeros, wherein at least one of said 10 bit signals has three consecutive zeros, and wherein each of said 10 bit signals does not have 10 consecutive ones.

2. The method according to claim 1, wherein each of said 10 bit signals does not have 9 ones.

3. The method according to claim 1, further comprising the step of recording said plurality of 10 bit output signals on a storage medium and wherein said plurality of 8 bit input signals comprises substantially all 8 bit signal permutations.

4. The method according to claim 1, wherein said system comprises a recording and reproducing system.

5. The method according to claim 1, wherein the step of converting is carried out by converting each of said 8 bit input signals into a 10 bit output signal with a DC component having a magnitude equal to or less than 2.

6. A method for converting an input signal representing data into a plurality of 10 bit output signals for use in a signal recording system, comprising the steps of:

receiving said input signal;

dividing said input signal into a plurality of 8 bit signals;

converting each of said 8 bit signals into a 10 bit output signal, wherein each of said 10 bit signals has less than 4 consecutive zeros, wherein at least one of said 10 bit signals has three consecutive zeros, and wherein each of said 10 bit signals does not have 10 consecutive ones.

7. The method according to claim 6, wherein each of said 10 bit signals does not have 9 ones.

8. The method according to claim 6, further comprising the step of recording said plurality of 10 bit output signals on a storage medium and wherein said plurality of 8 bit signals comprises substantially all 8 bit signal permutations.

9. The method according to claim 6, wherein said system comprises a recording and reproducing system.

10. The method according to claim 6, wherein the step of converting is carried out by converting each of said 8 bit input signals into a 10 bit output signal with a DC component having a magnitude equal to or less than 2.

11. Apparatus for converting a plurality of 8 bit input signals into a plurality of 10 bit output signals for use in a signal recording system, comprising:

means for receiving said plurality of 8 bit input signals; and means for converting each of said 8 bit input signals into a 10 bit output signal, wherein each of said 10 bit signals has less than 4 consecutive zeros, wherein at least one of said 10 bit signals has three consecutive zeros, and wherein each of said 10 bit signals does not have 10 consecutive ones.

12. Apparatus according to claim 11, wherein each of said 10 bit signals does not have 9 ones.

13. Apparatus according to claim 11, further comprising means for recording said plurality of 10 bit output signals on a storage medium and wherein said plurality of 8 bit input signals comprises substantially all 8 bit signal permutations.

14. Apparatus according to claim 11, wherein said system comprises a recording and reproducing system.

15. The apparatus according to claim 11, wherein said means for converting is operable to convert each of said 8 bit input signals into a 10 bit output signal with a DC component having a magnitude equal to or less than 2.

* * * * *